(12) United States Patent
Steinhauser

(10) Patent No.: US 10,163,668 B2
(45) Date of Patent: Dec. 25, 2018

(54) THERMAL DYNAMIC RESPONSE SENSING SYSTEMS FOR HEATERS

(71) Applicant: WATLOW ELECTRIC MANUFACTURING COMPANY, St. Louis, MO (US)

(72) Inventor: Louis P. Steinhauser, St. Louis, MO (US)

(73) Assignee: WATLOW ELECTRIC MANUFACTURING COMPANY, St. Loius, AA (US)

( * ) Notice: Subject to any disclaimer, the term of this patent is extended or adjusted under 35 U.S.C. 154(b) by 559 days.

(21) Appl. No.: 14/530,670

(22) Filed: Oct. 31, 2014

(65) Prior Publication Data

US 2015/0055940 A1 Feb. 26, 2015

Related U.S. Application Data

(63) Continuation-in-part of application No. 13/599,648, filed on Aug. 30, 2012, now Pat. No. 9,263,305.

(60) Provisional application No. 61/528,939, filed on Aug. 30, 2011, provisional application No. 61/635,310, filed on Apr. 19, 2012.

(51) Int. Cl.
  *H01L 21/67* (2006.01)
  *H05B 3/22* (2006.01)
  *H05B 1/02* (2006.01)
  *H01L 21/683* (2006.01)

(52) U.S. Cl.
  CPC .. *H01L 21/67248* (2013.01); *H01L 21/67103* (2013.01); *H01L 21/67109* (2013.01); *H01L 21/6831* (2013.01); *H05B 1/0233* (2013.01); *H05B 3/22* (2013.01); *Y10T 156/10* (2015.01)

(58) Field of Classification Search
USPC .......................................................... 219/201
See application file for complete search history.

(56) References Cited

U.S. PATENT DOCUMENTS

| 6,016,383 | A  | * | 1/2000 | Gronet .................. C23C 16/481 219/405 |
| 6,100,506 | A  | * | 8/2000 | Colelli, Jr. ........ H01L 21/67248 118/725 |
| 6,122,439 | A  | * | 9/2000 | Gronet .................. C23C 16/481 219/390 |
| 6,512,207 | B1 | * | 1/2003 | Dress ................ H01L 21/67248 118/724 |
| 6,786,175 | B2 | * | 9/2004 | Dhindsa ............ C23C 16/45565 118/723 E |
| 6,907,742 | B2 | * | 6/2005 | Kuo .................. H01L 21/67109 62/430 |

(Continued)

FOREIGN PATENT DOCUMENTS

DE 199 07 497 8/2000

OTHER PUBLICATIONS

ISRWO of PCT/US15/057905 dated Jan. 22, 2016.

*Primary Examiner* — Anne M Antonucci
*Assistant Examiner* — Renee LaRose
(74) *Attorney, Agent, or Firm* — Burris Law, PLLC

(57) ABSTRACT

A heater system includes a heater assembly, an imaging device and a control system. The heater assembly includes a plurality of heating zones. The imaging device acquires an image of the heater assembly. The control system determines variations in the plurality of heating zones based on the thermal image.

19 Claims, 23 Drawing Sheets

(56) References Cited

U.S. PATENT DOCUMENTS

| | | | |
|---|---|---|---|
| 8,536,492 B2* | 9/2013 | Ramamurthy | H01L 21/67103 219/390 |
| 2004/0195229 A1* | 10/2004 | Szekeresch | H01L 21/67248 219/390 |
| 2008/0142501 A1 | 6/2008 | Morioka et al. | |
| 2009/0235866 A1 | 9/2009 | Kataigi et al. | |
| 2010/0240154 A1 | 9/2010 | Ishida | |
| 2011/0232845 A1* | 9/2011 | Riker | H01J 37/32357 156/345.33 |
| 2013/0161305 A1 | 6/2013 | Ptasienski et al. | |
| 2013/0319762 A1* | 12/2013 | Harris | H01L 21/67103 174/94 R |
| 2014/0202618 A1 | 7/2014 | Hayashi | |

* cited by examiner

US 10,163,668 B2

THERMAL DYNAMIC RESPONSE SENSING SYSTEMS FOR HEATERS

CROSS-REFERENCE TO RELATED APPLICATIONS

This application is a continuation-in-part and claims the benefit of U.S. Ser. No. 13/599,648, filed on Aug. 30, 2012 and titled, "HIGH DEFINITION HEATER AND METHOD OF OPERATION," which claims the benefit of provisional application ser. nos. 61/528,939 filed on Aug. 30, 2011 and 61/635,310 filed on Apr. 19, 2012. The contents of the above applications are incorporated herein by reference in their entirety.

FIELD

The present disclosure relates to heater systems, and in particular, heater systems that can deliver a precise temperature profile to a heating target during operation in order to compensate for heat loss and/or other variations, in such applications as chucks or susceptors for use in semiconductor processing.

BACKGROUND

The statements in this section merely provide background information related to the present disclosure and may not constitute prior art.

In the art of semiconductor processing, for example, a chuck or susceptor is used to hold a substrate (or wafer) and to provide a uniform temperature profile to the substrate during processing. Referring to FIG. 1, a support assembly 10 for an electrostatic chuck is illustrated, which includes the electrostatic chuck 12 with an embedded electrode 14, and a heater plate 16 that is bonded to the electrostatic chuck 12 through an adhesive layer 18, which is typically a silicone adhesive. A heater 20 is secured to the heater plate 16, which may be an etched-foil heater, by way of example. This heater assembly is bonded to a cooling plate 22, again through an adhesive layer 24 that is typically a silicone adhesive. The substrate 26 is disposed on the electrostatic chuck 12, and the electrode 14 is connected to a voltage source (not shown) such that electrostatic power is generated, which holds the substrate 26 in place. A radio frequency (RF) or microwave power source (not shown) may be coupled to the electrostatic chuck 12 within a plasma reactor chamber that surrounds the support assembly 10. The heater 20 thus provides requisite heat to maintain temperature on the substrate 26 during various in-chamber plasma semiconductor processing steps, including plasma enhanced film deposition or etch.

During all phases of processing of the substrate 26, the temperature profile of the electrostatic chuck 12 is tightly controlled in order to reduce processing variations within the substrate 26 being etched, while reducing total processing time.

SUMMARY

In one form of the present disclosure, a heater system comprises a heater assembly that includes a plurality of heating zones. The heater system has an imaging device that acquires an image of the heater assembly. A control system determines variations within the plurality of heating zones based on the image from the imaging device.

In another form of the present disclosure, a heater system is comprises a heater assembly having a plurality of heating elements. The heater system has a controller that provides stimulus, causing disturbance to a desired temperature of the heater assembly. A control system is in communication with the controller and controls the heater assembly to maintain a desired temperature profile on the heater assembly based on information about the controller.

In still another form, a heater system comprises a processing chamber that defines an interior wall. A heater assembly is disposed on the interior wall and the heater assembly defines a heating surface. The heating surface includes a plurality of heating zones and a plurality of heating elements. A control system is in communication with the heater assembly for monitoring a temperature distribution of the heating surface and the interior wall of the chamber. The control system monitors the electrical resistance of the heating elements to determine the temperature distribution of the plurality of heating zones.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The drawings described herein are for illustration purposes only and are not intended to limit the scope of the present disclosure in any way.

DETAILED DESCRIPTION

The following description is merely exemplary in nature and is not intended to limit the present disclosure, application, or uses. For example, the following forms of the present disclosure are directed to chucks for use in semiconductor processing, and in some instances, electrostatic chucks. However, it should be understood that the heaters and systems provided herein may be employed in a variety of applications and are not limited to semiconductor processing applications.

Figure 2:
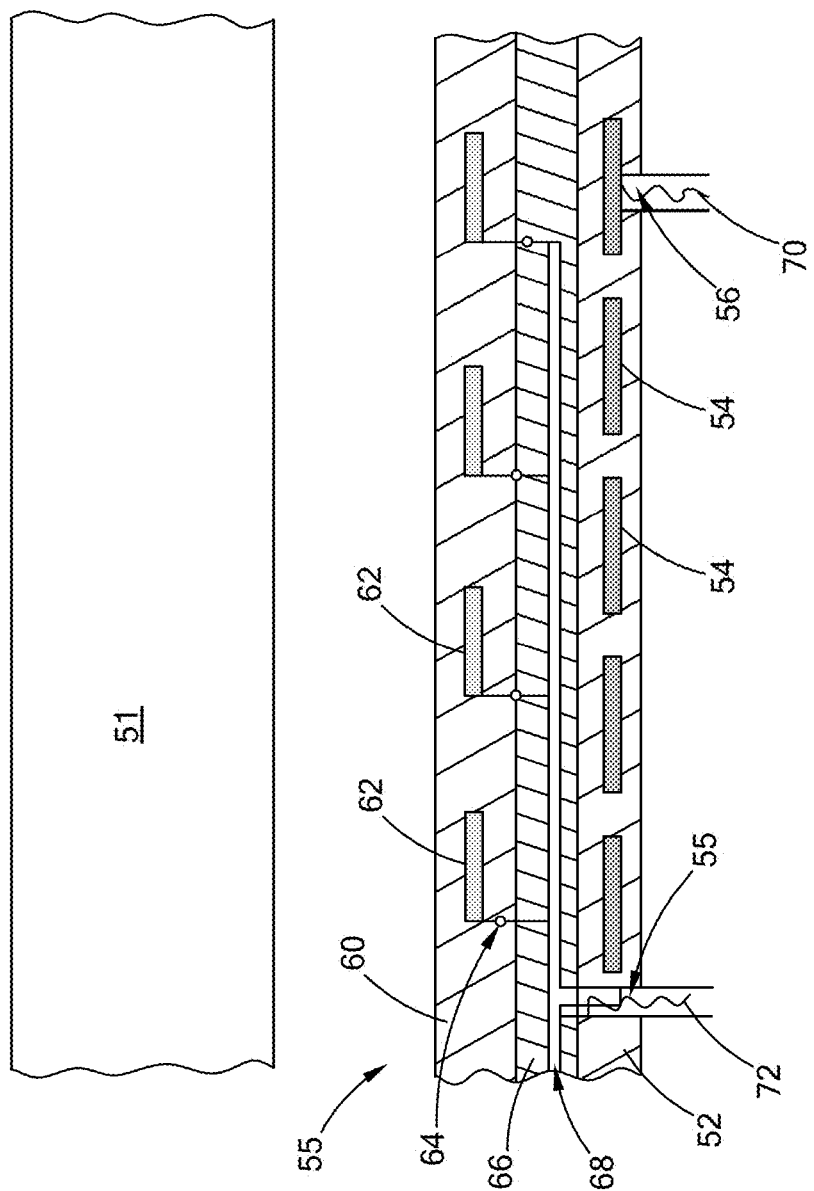
FIG. 2 is a partial side view of a heater having a tuning layer and constructed in accordance with the principles of one form of the present disclosure.

Referring to FIG. 2, one form of the present disclosure is a heater 50 that includes a base heater layer 52 that provides primary heating, and a tuning layer 60 that provides fine tuning of a heat distribution provide by the heater 50. The base heater layer 52 includes at least one heater circuit 54 embedded therein and at least one aperture 56 (or via) formed therethrough for connecting the heater circuit 54 to a power supply (not shown). The tuning layer 60 is disposed proximate the base heater layer 52 as shown and includes a plurality of individual heating elements 62 embedded therein, which are independently controlled. At least one aperture 64 is formed through the tuning layer 60 for connecting the plurality of individual heating elements 62 to the power supply and controller (not shown). As further shown, a routing layer 66 is disposed between the base heater layer 52 and the tuning layer 60 and defines an internal cavity 68. A first set of electrical leads 70 connect the heater circuit 54 to the power supply, and extend through the heater layer aperture 56. A second set of electrical leads 72 connect a plurality of heating elements 62 to the power supply and extend through the internal cavity 68 of the routing layer 66. It should be understood that the routing layer 66 is optional, and the heater 50 could be employed without the routing layer 66 and instead having only the base heater layer 52 and the tuning heater layer 60.

In another form, rather than providing fine tuning of a heat distribution, the tuning layer 60 may alternately be used to measure temperature in the chuck 12. This form provides for a plurality of area-specific or discrete locations, of temperature dependent resistance circuits. Each of these temperature sensors can be individually read via a multiplexing switching arrangement, exemplary forms of which are set forth in greater detail below, which allows substantially more sensors to be used relative to the number of signal wires required to measure each individual sensor. The temperature sensing feedback can provide necessary information for control decisions, for instance, to control a specific zone of backside cooling gas pressure to regulate heat flux from the substrate 26 to the chuck 12. This same feedback can also be used to replace or augment temperature sensors installed near the base heater 50 for temperature control of base heating zones 54 or balancing plate cooling fluid temperature (not shown) via ancillary cool fluid heat exchangers.

In one form, the base heater layer 52 and the tuning heater layer 60 are formed by enclosing the heater circuit 54 and the tuning layer heating elements 62 in a polyimide material for medium temperature applications, which are generally below 250° C. Further, the polyimide material may be doped with materials in order to increase thermal conductivity.

In other forms, the base heater layer 52 and/or the tuning heater layer 60 are formed by a layered process, wherein the layer is formed through application or accumulation of a material to a substrate or another layer using processes associated with thick film, thin film, thermal spraying, or sol-gel, among others.

In one form, the base heating circuit 54 comprises Inconel® alloy and the tuning layer heating elements 62 comprises a Nickel material. In still another form, the tuning layer heating elements 62 are formed of a material having sufficient temperature coefficient of resistance such that the elements function as both heaters and temperature sensors, commonly referred to as "two-wire control." Such heaters and their materials are disclosed in U.S. Pat. No. 7,196,295 and pending U.S. patent application Ser. No. 11/475,534, which are commonly assigned with the present application and the disclosures of which are incorporated herein by reference in their entirety.

With the two-wire control, various forms of the present disclosure include temperature, power, and/or thermal impedance based control over the layer heating elements 62 through knowledge or measurement of voltage and/or current applied to each of the individual elements in the thermal impedance tuning layer 60, converted to electrical power and resistance through multiplication and division, corresponding in the first instance, identically to the heat flux output from each of these elements and in the second, a known relationship to the element temperature. Together these can be used to calculate and monitor the thermal impedance load on each element to allow an operator or control system to detect and compensate for area-specific thermal changes that may result from, but are not limited to, physical changes in the chamber or chuck due to use or maintenance, processing errors, and equipment degradation. Alternatively, each of the individually controlled heating elements in the thermal impedance tuning layer 60 can be assigned a setpoint resistance corresponding to the same or different specific temperatures which then modify or gate the heat flux originating from corresponding areas on a substrate through to the base heater layer 52 to control the substrate temperature during semiconductor processing.

In one form, the heater 50 is bonded to a chuck 51, for example, by using a silicone adhesive or even a pressure sensitive adhesive. Therefore, the base heater layer 52 provides primary heating, and the tuning layer 60 fine tunes, or adjusts, the heating profile such that a uniform or desired temperature profile is provided to the chuck 51, and thus the substrate (not shown).

In another form of the present disclosure, the coefficient of thermal expansion (CTE) of the tuning layer heating elements 62 is matched to the CTE of the tuning heating layer substrate 60 in order to improve thermal sensitivity of the tuning layer heating elements 62 when exposed to strain loads. Many suitable materials for two-wire control exhibit similar characteristics to Resistor Temperature Devices (RTDs), including resistance sensitivity to both temperature and strain. Matching the CTE of the tuning layer heating elements 62 to the tuning heater layer substrate 60 reduces strain on the actual heating element. And as the operating temperatures increase, strain levels tend to increase, and thus CTE matching becomes more of a factor. In one form, the tuning layer heating elements 62 are a high purity Nickel-Iron alloy having a CTE of approximately 15 ppm/° C., and the polyimide material that encloses it has a CTE of approximately 16 ppm/° C. In this form, materials that bond the tuning heater layer 60 to the other layers exhibit elastic characteristics that physically decouple the tuning heater layer 60 from other members of the chuck 12. It should be understood that other materials with comparable CTEs may also be employed while remaining within the scope of the present disclosure.

Figure 3:
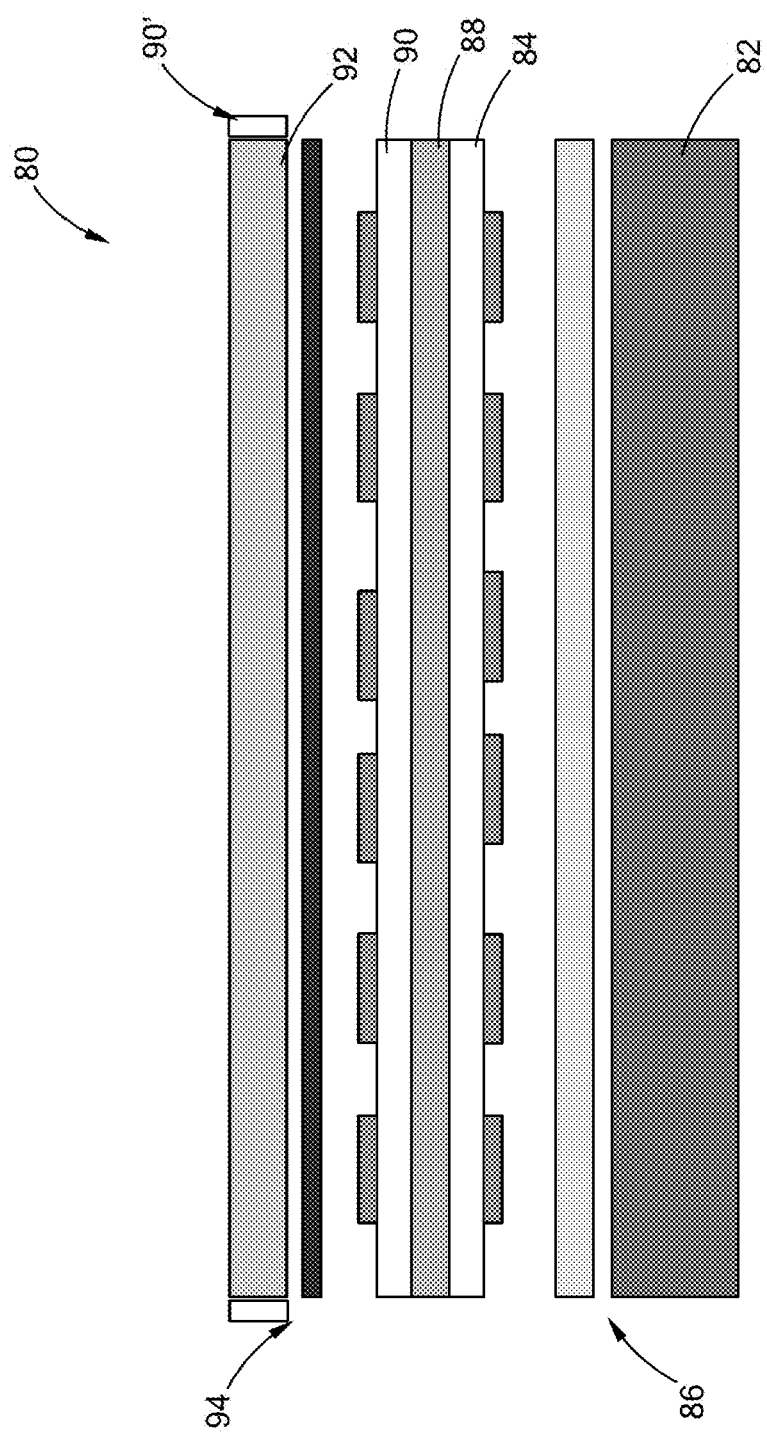
FIG. 3 is an exploded side view of another form of the heater of FIG. 1 having a tuning layer or tuning heater and constructed in accordance with the principles of the present disclosure.
Figure 4:
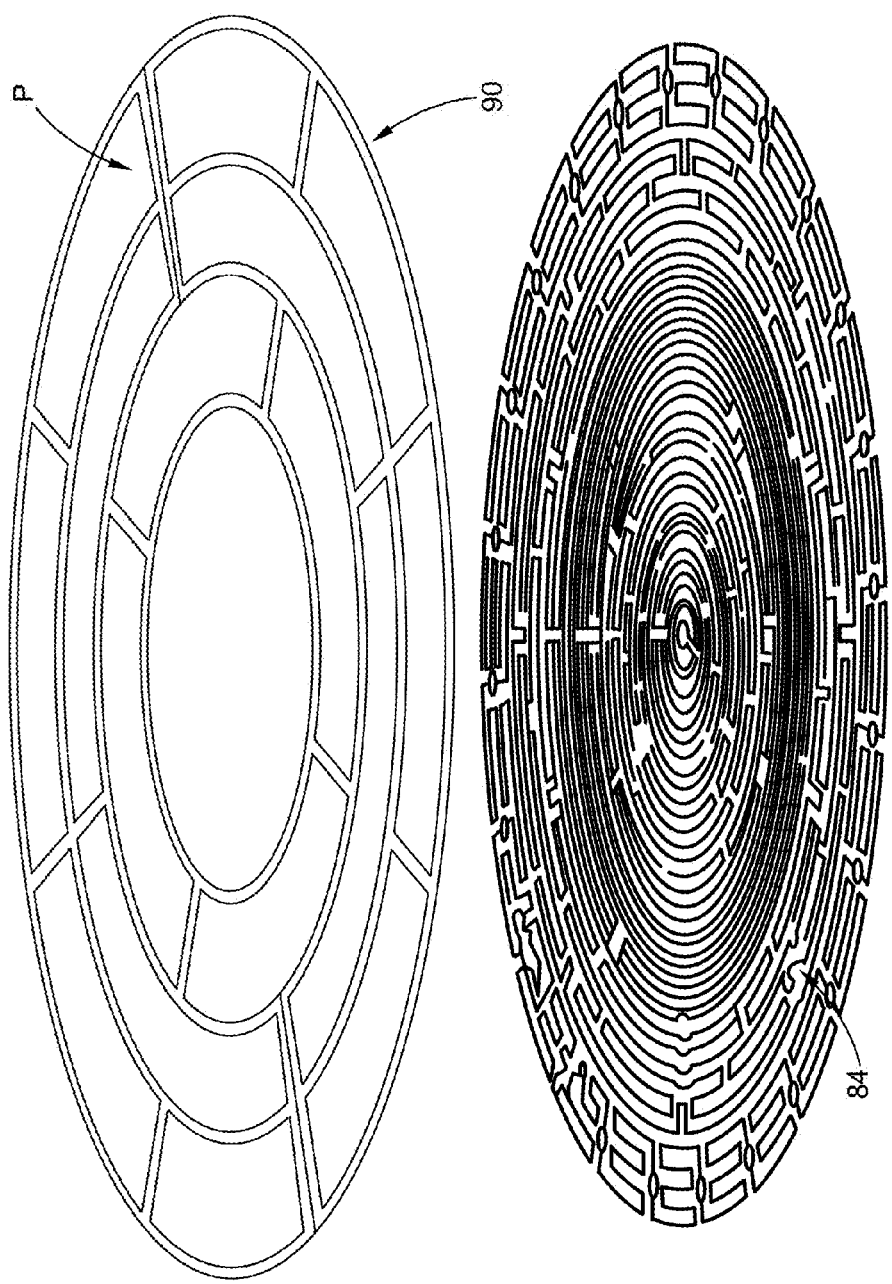
FIG. 4 is a perspective exploded view of the heater of FIG. 3, illustrating an exemplary four (4) zones for the base heater and eighteen (18) zones for the tuning heater in accordance with the principles of the present disclosure.
Figure 5:
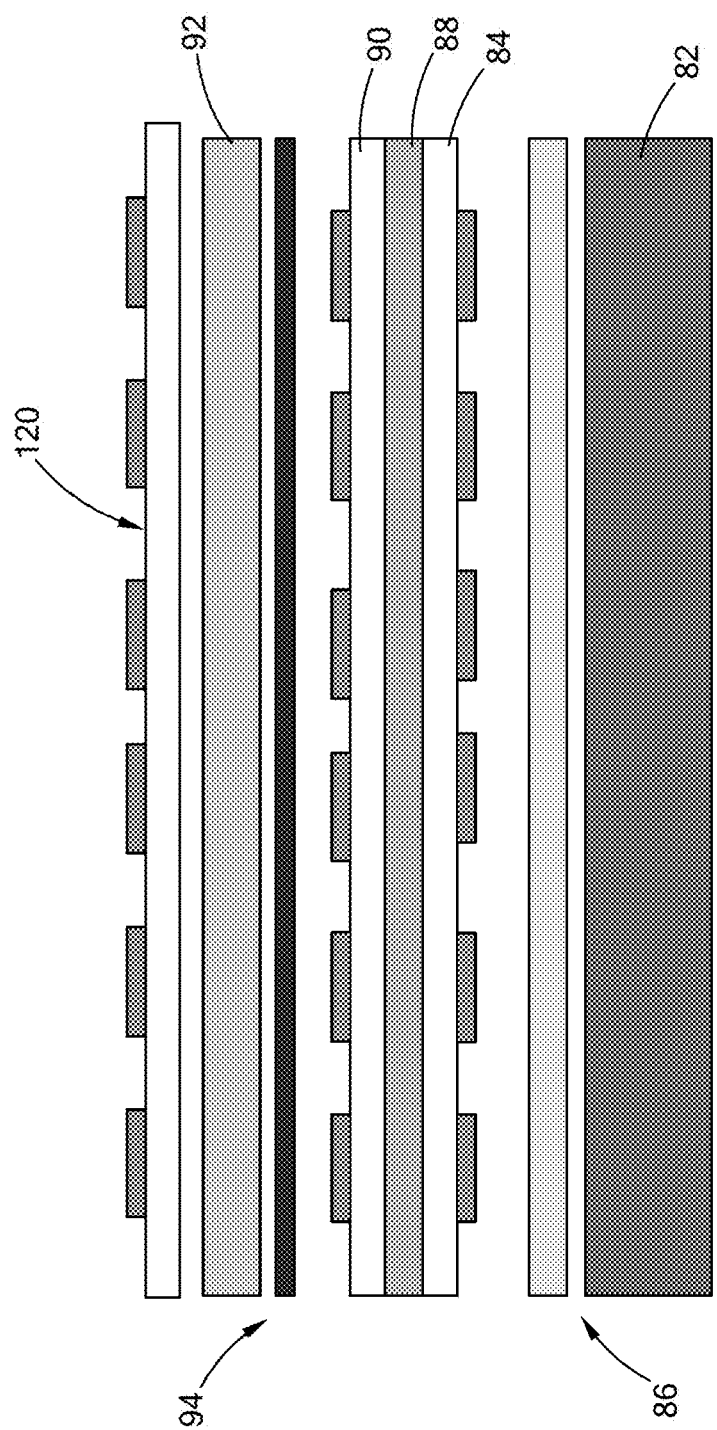
FIG. 5 is a side view of another form of a high definition heater system having a supplemental tuning layer and constructed in accordance with the principles of the present disclosure.

Referring now to FIGS. 3-5, one exemplary form of the heater having both a base heater layer and a tuning layer (as generally set forth above in FIG. 2) is illustrated and generally indicated by reference numeral 80. The heater 80 is a high definition heater that includes a base plate 82, a base heater 84 secured to the base plate 82, and a tuning heater 90. The base plate 82 is also referred to as a cooling plate, which in one form is an Aluminum plate approximately 16mm in thickness. The base heater 84 is secured to the base plate 82, in one form using an elastomeric bond layer 86 as shown. The elastomeric bond may be one disclosed in U.S. Pat. No. 6,073,577, which is incorporated herein by reference in its entirety. A substrate 88 is disposed on top of the base heater 84 and is an Aluminum material approximately 1mm in thickness according to one form of the present disclosure. The substrate 88 is designed to have a thermal conductivity to dissipate a requisite amount of power from the base heater 84. Because the base heater 84 has relatively high power, without a requisite amount of thermal conductivity, this base heater 84 would leave "witness" marks (from the resistive circuit trace) on adjacent components, thereby reducing the performance of the overall heater system.

The tuning heater 90 is disposed on top of the substrate 88 and is secured to a chuck 92 using an elastomeric bond layer 94, as set forth above. The chuck 92 in one form is an Aluminum Oxide material having a thickness of approximately 2.5 mm. It should be understood that the materials and dimensions as set forth herein are merely exemplary and thus the present disclosure is not limited to the specific forms as set forth herein. Additionally, the tuning heater 90 has lower power than the base heater 84, and as set forth above, the substrate 88 functions to dissipate power from the base heater 84 such that "witness" marks do not form on the tuning heater 90.

The base heater 84 and the tuning heater 90 are shown in greater detail in FIG. 4, in which an exemplary four (4) zones are shown for the base heater 84, and eighteen (18) zones for the tuning heater 90. In one form, the high definition heater 80 is adapted for use with chuck sizes of 450 mm, however, the high definition heater 80 may be employed with larger or smaller chuck sizes due to its ability to highly tailor the heat distribution. Additionally, the high definition heater 80 may be employed around a periphery (shown by area P) of the chuck (across a horizontal plane), or along a vertical location (for example, a tuning layer 90' in FIG. 3), or in discrete predetermined locations across or along the chuck, or around the periphery of other components or combinations of components, rather than in a stacked/planar configuration as illustrated herein. Further still, the high definition heater 80 may be employed in process kits, chamber walls, lids, gas lines, and showerheads, among other components within semiconductor processing equipment. It should also be understood that the heaters and control systems illustrated and described herein may be employed in any number of applications, and thus the exemplary semiconductor heater chuck application should not be construed as limiting the scope of the present disclosure.

The present disclosure also contemplates that the base heater 84 and the tuning heater 90 not be limited to a heating function. It should be understood that one or more of these members, referred to as a "base functional layer" and a "tuning layer," respectively, may alternately be a temperature sensor layer or other functional member while remaining within the scope of the present disclosure. Other functions may include, by way of example, a cooling layer or a diagnostic layer that would collect sensor input such as various electrical characteristics, among others.

As shown in FIG. 5, a dual tuning capability may be provided with the inclusion of a secondary tuning layer heater 120 on the top surface of the chuck 12. The secondary tuning layer may alternately be used as a temperature sensing layer rather than a heating layer while remaining within the scope of the present disclosure. Accordingly, any number of tuning layer heaters may be employed and should not be limited to those illustrated and described herein.

In another form, the base functional layer may include a plurality of thermoelectric elements rather than the base heater 84 construction as set forth above. These thermoelectric elements may also be arranged in zones and are generally disposed on top of, or proximate, the base plate or cooling plate 82.

Figure 6:
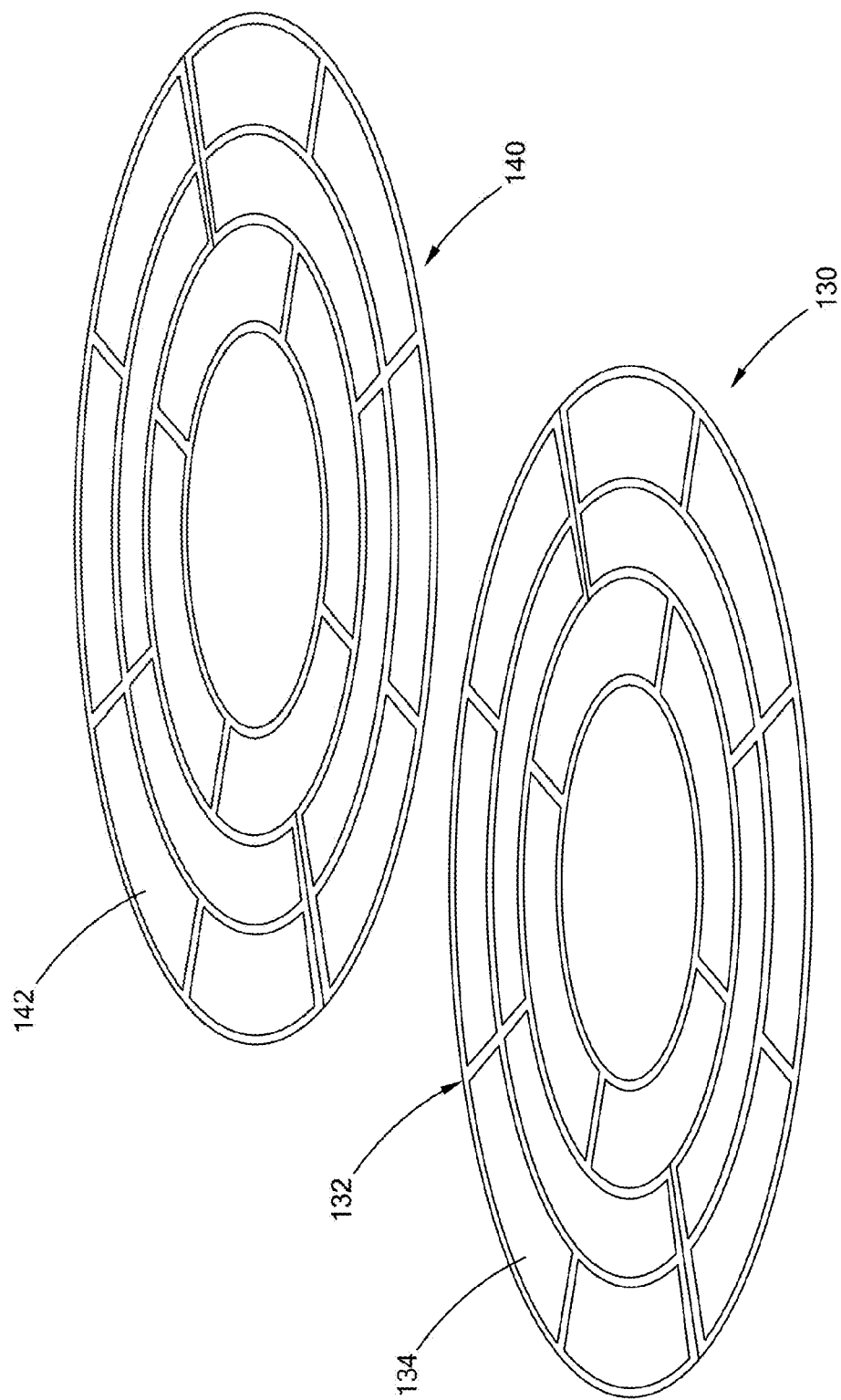
FIG. 6 is an exploded perspective view of alternating tuning layers that are offset from one another in accordance with another form of the present disclosure.

In still another form, the multiple tuning layers may be employed in a "stacked" configuration, or configured vertically such that individual resistive traces are offset from adjacent resistive traces on opposed layers to compensate for the gaps that exist between traces. For example, as shown in FIG. 6, a first tuning layer 130 is offset from a second tuning layer 140 such that the traces 142 of tuning layer 140 are aligned adjacent the gaps 132 between the traces 134 of the first tuning layer 130, and vice versa. In another form, a "checkerboard" design may be employed in order to compensate for gaps or hot spots between adjacent layers.

Figure 7:
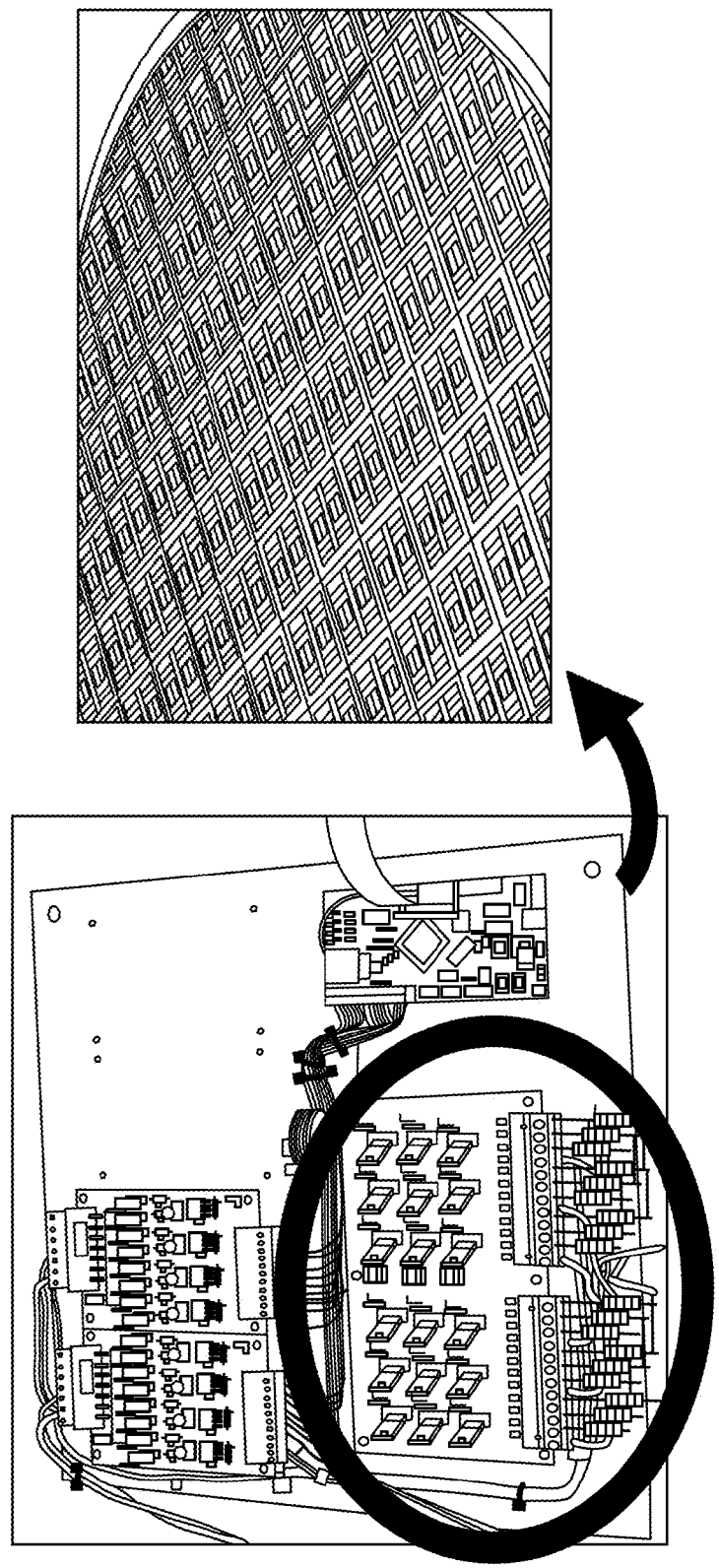
FIG. 7 is a perspective view of control devices that are embedded into layers of the heater chuck assembly in accordance with one form of the present disclosure.
Figure 8:
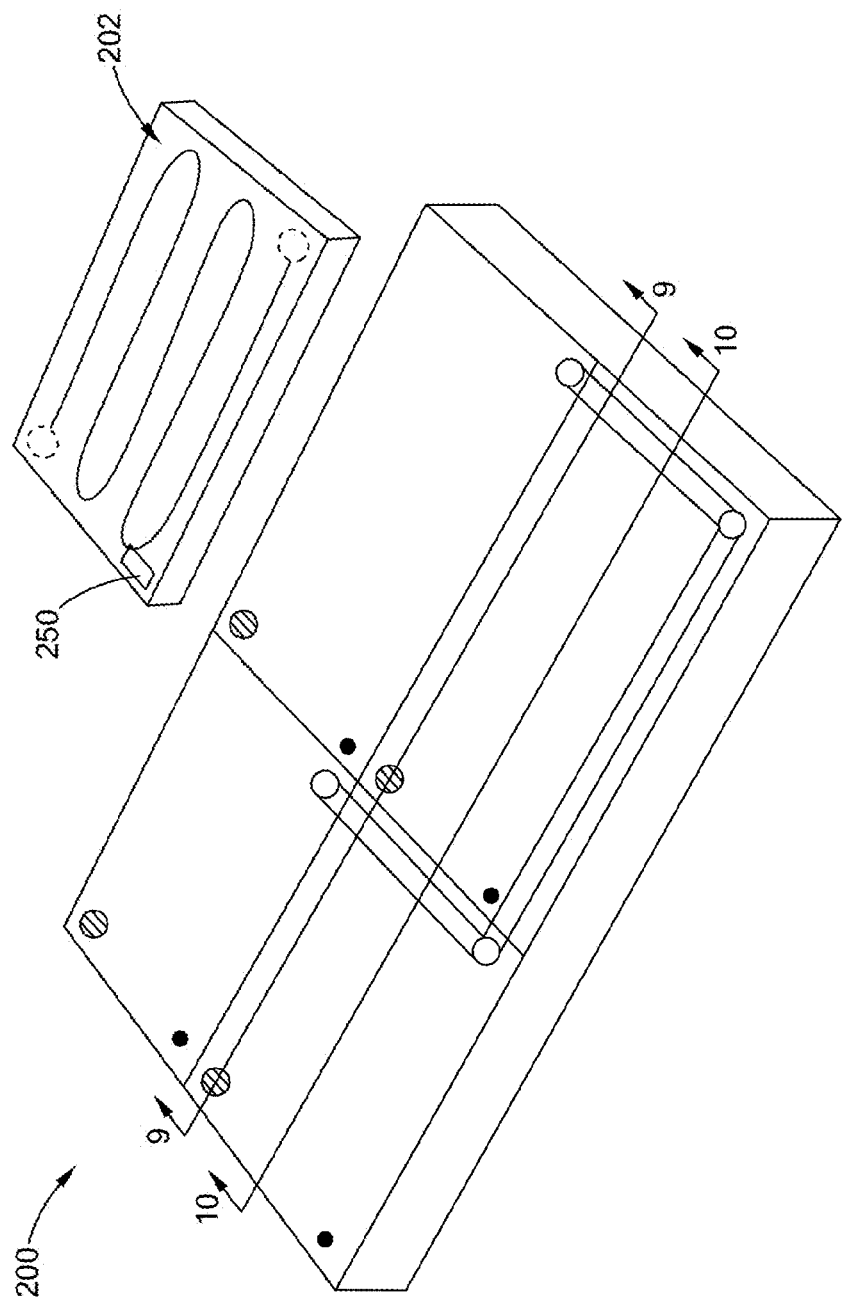
FIG. 8 is a perspective view of a heater system having independently controllable heater elements constructed in accordance with the principles of the present disclosure.
Figure 9:
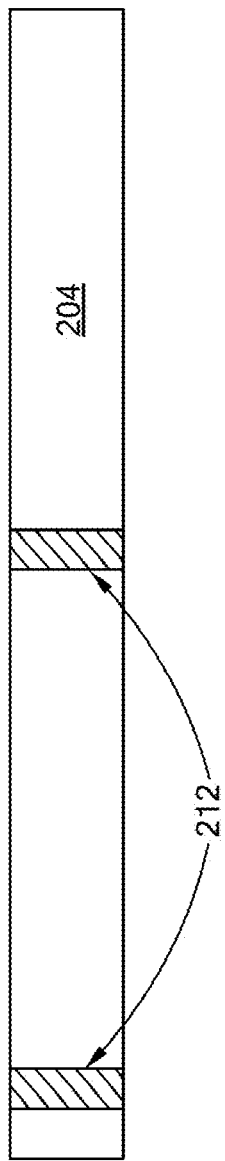
FIG. 9 is a cross-sectional view, taken along line 9-9 of FIG. 8, illustrating vias of the heater system and constructed in accordance with the principles of the present disclosure.
Figure 10:
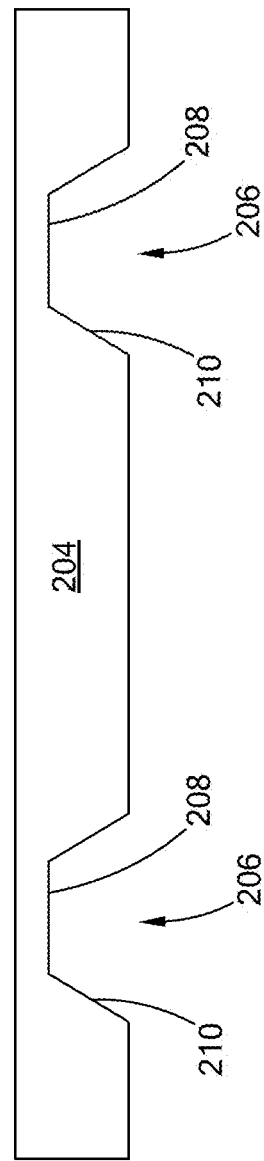
FIG. 10 is a partial cross-sectional view, taken along line 10-10 of FIG. 8, illustrating an upper base of the heater system and constructed in accordance with the principles of the present disclosure.
Figure 11:
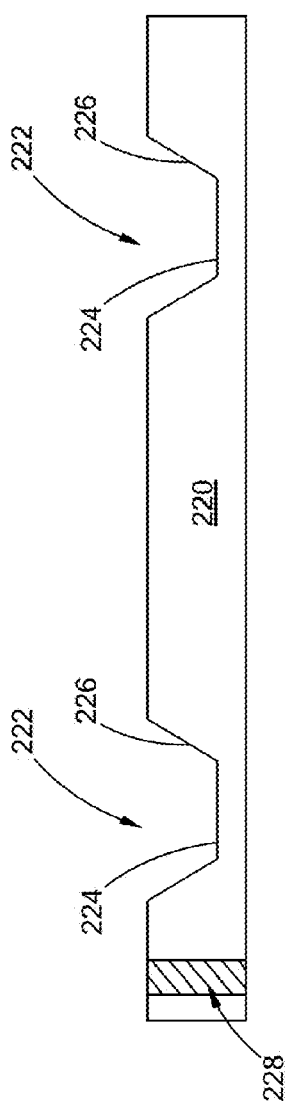
FIG. 11 is a partial cross-sectional view, taken along line 11-11 of FIG. 8, illustrating a lower base of the heater system and constructed in accordance with the principles of the present disclosure.
Figure 12:
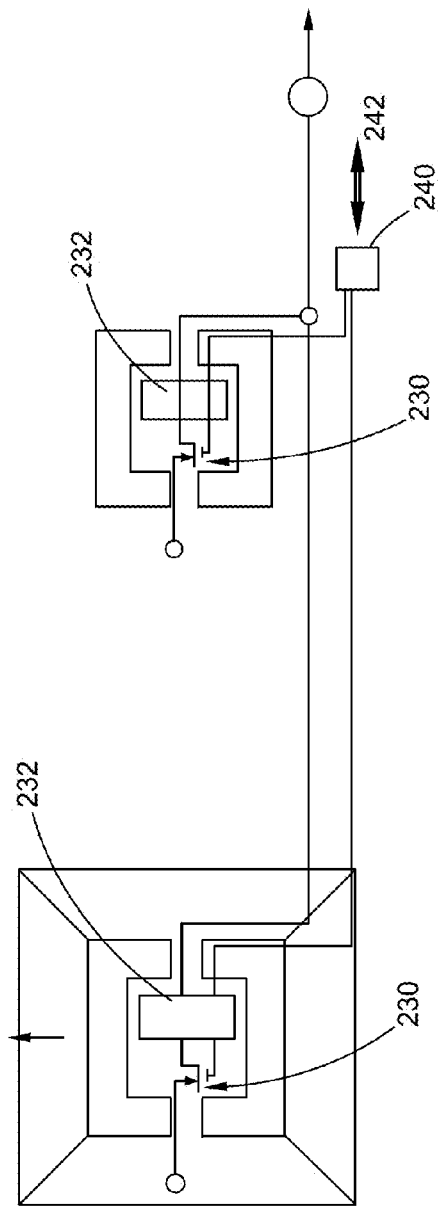
FIG. 12 is a top view of FIG. 11, illustrating elements within tapered cavities of the lower base and constructed in accordance with the principles of the present disclosure.

Referring to FIG. 7, the threshold voltage switching circuits, which in one form comprise discrete solid state devices that electrically conduct in one direction when the voltage threshold across the circuit is exceeded and which, are embedded into or attached to the body of the heater chuck, which may be in a packaged form or generally embedded as bare die components. In another form, the control elements are embedded in the bond layer 86 as illustrated above. It should be understood that the control elements may be embedded within any of the components or assemblies thereof while remaining within the scope of the present disclosure. Alternately, the threshold voltage switching circuits on a single package silicon controls device (ASIC) may be embedded into or attached to the chuck in one form of the present disclosure. Additional controls devices may also be employed in order to provide redundancy should any of the components fail during operation.

One exemplary form of embedding controls is illustrated in FIGS. 8-12. As shown, this alternate form of a heater system is illustrated and generally indicated by reference numeral 200. The heater system 200 comprises a plurality of independently controllable heater elements 202, the operation of which is set forth in greater detail below, in order to provide a highly tailored temperature profile to a heating target, such as a uniform temperature profile to a substrate in semiconductor processing as set forth above. An upper base 204 is disposed proximate the heater elements 202, and in one form, the heater elements 202 are disposed on the upper base 204, such as an etched foil bonded to or a layered heater deposited onto the upper base 204. The upper base 204 defines a plurality of tapered cavities 206, which are aligned with each of the heater elements. The tapered cavities 206 in this form include an upper wall 208 and tapered side walls 210 as shown. The upper base 204 further comprises a plurality of power vias 212 in order to provide a passageway for power and control lines, as set forth below.

A lower base 220 is adjacent the upper base 204 and defines a plurality of reverse tapered cavities 222 aligned with the tapered cavities 206 of the upper base 204. The reverse tapered cavities 222 similarly define a lower wall 224 and tapered sidewalls 226. The lower base 220 further comprises a plurality of power vias 228 in communication with the power vias 212 of the upper base 204, which also serve as passageways for power and control lines.

Figure 1:
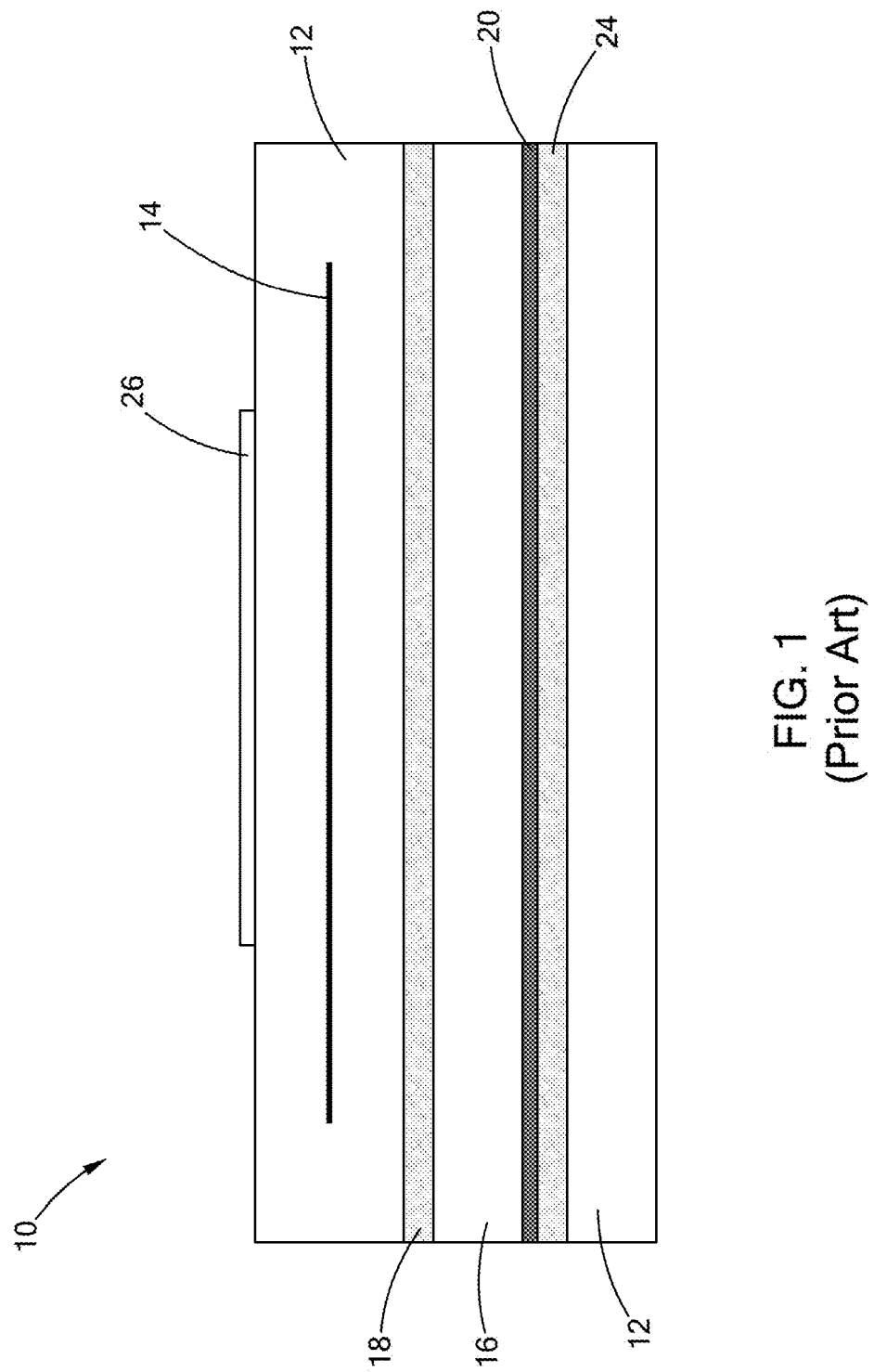
FIG. 1 is an elevated side view of a prior art electrostatic chuck.
Figure 14:
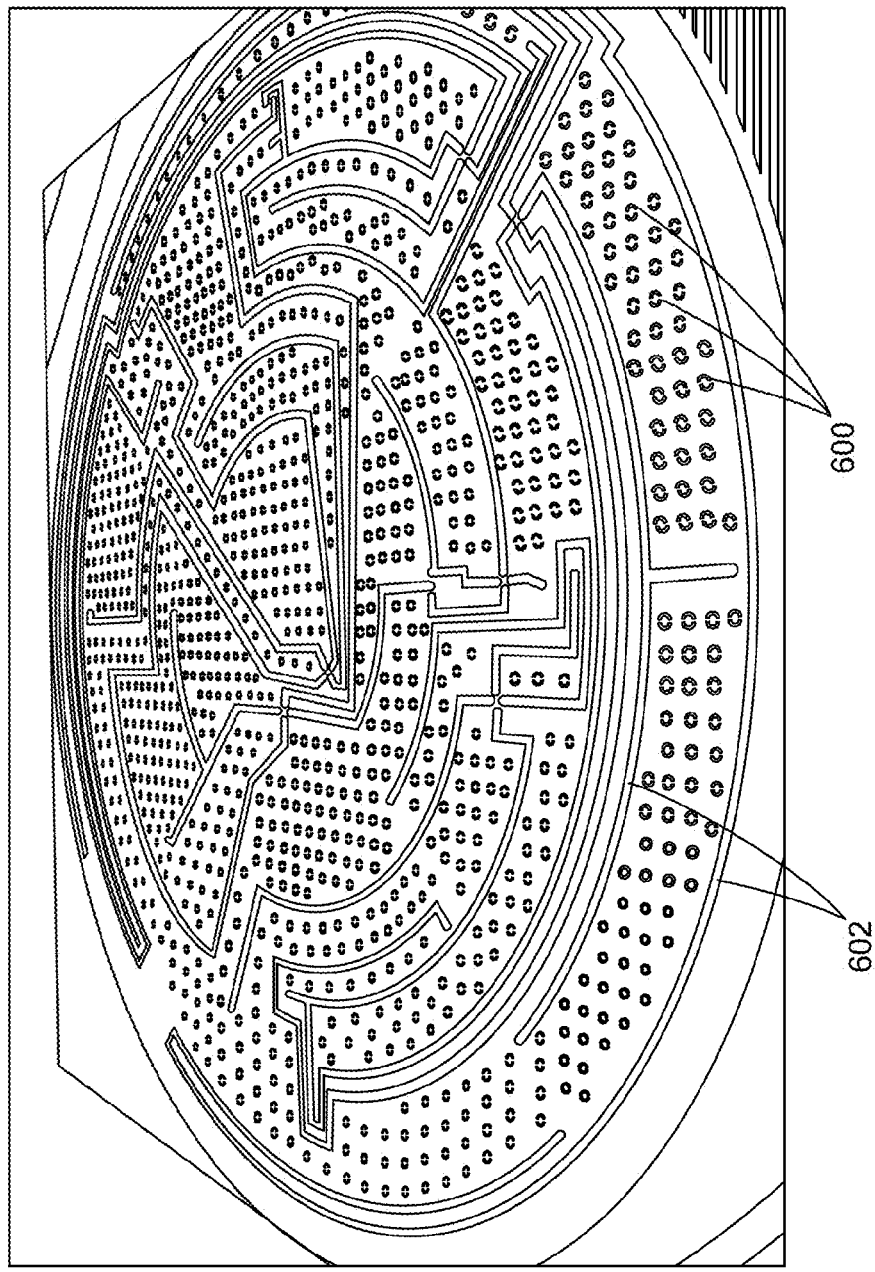
FIG. 14 is a perspective view illustrated a plurality of support elements constructed in accordance with another form of the present disclosure.

As best shown in FIG. 14, the shape of the cavities 206, 222 are configured to provide for an efficient transfer of heat from the heater elements 202 to a cooling plate (shown as element 22 in FIG. 1) and also to reduce the thermal impact of the cavities and their components on the performance and temperature profile provided by the heater elements 202. Accordingly, the "footprint" of the cavity is smaller near the heater elements 202, and the cavity gradually increases in size to direct the heat flux around the cavity 206, and then gradually decreases in size to direct the heat flux around the cavity 222 towards the cooling plate 22. It should be understood that other geometries for the cavities 206 and 222 may be provided by the present disclosure, and thus the tapered configurations should not be construed as limiting the scope of the present disclosure.

As further shown, a plurality of pairs of switching elements 230 and control elements 232 are disposed within the reverse tapered cavities 222 of the lower base 220 and in communication with the plurality of heater elements 202. Generally, the switching elements 230 and control elements 232 control operation of the heater elements 202 in order to provide a requisite temperature profile, and in one application, a uniform temperature profile to the substrate in semiconductor processing equipment as set forth above. More specifically, and in one form, the control element is a microprocessor. In another form, the control element is a circuit in accordance with the raster boost heater as set forth above. In one form, the control elements 232 communicate across a digital bus 234 for temperature control of the heater elements 202.

The heater system 200 further comprises a multiplexer 240 in communication with each of the control elements 232, which sends the appropriate control signals to each of the heater elements 202 for a desired temperature profile. In one form, the multiplexer 240 communicates with a power supply (not shown) through an optical bus 242.

Additionally, the heater system 200 may also include a plurality of discrete temperature sensors 250 disposed proximate the plurality of heater elements 202. In an alternate form, the heater elements 202 comprise a resistive material having sufficient temperature coefficient of resistance characteristics such that the resistive material functions as both a heater and a temperature sensor, as set forth herein in other forms of the present disclosure.

In an electrostatic chuck application, the heater system 200 further comprises an RF filter 260, which in one form is in communication with a digital bus 262.

Temperature calibration of any of the systems set forth herein may be performed by first measuring the individual resistances of the tuning layer heaters using a standard resistance meter. In another method, alone or in addition to the method above, the tuning layer heater elements 62 may be held at a constant temperature and pulsed as in normal operation but for short duration only, and then the resistance is calculated and set into the control system. An iterative technique of this at the same or multiple temperature points will calibrate the system for control.

Figure 13:
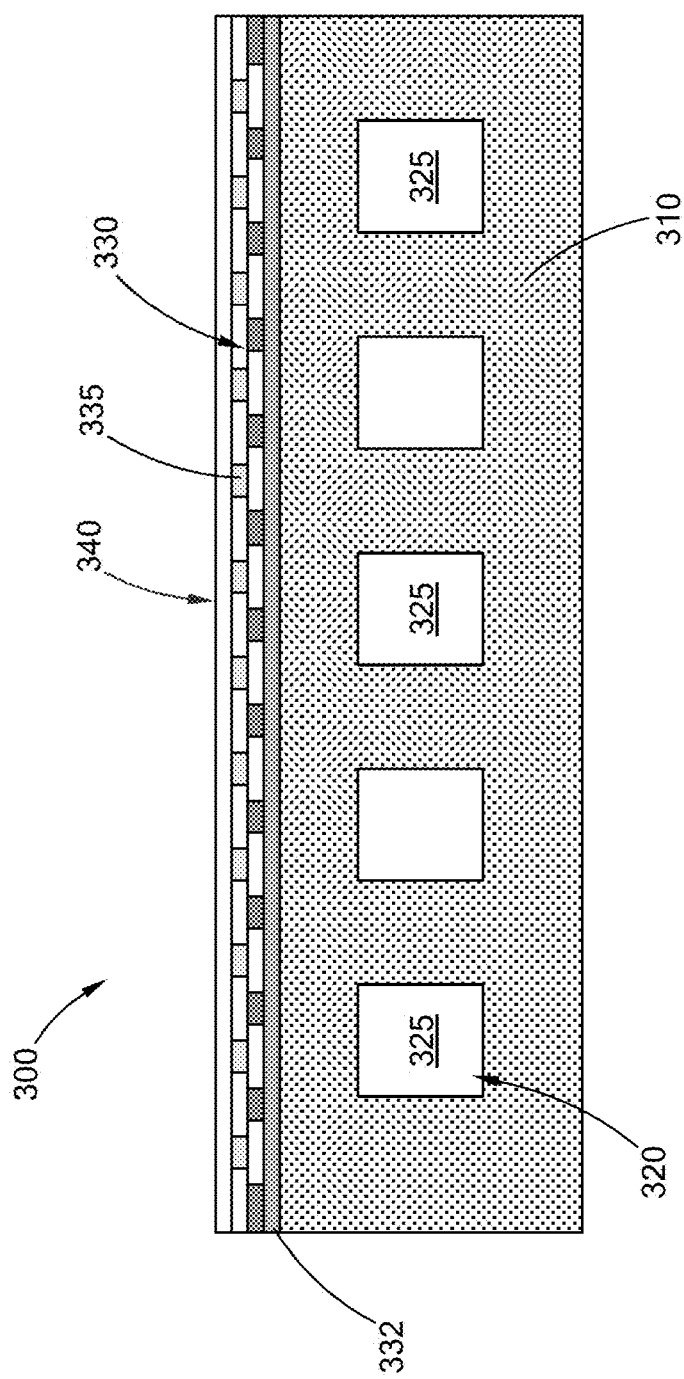
FIG. 13 is a cross-sectional view of another form of a high definition heater system with the base member having fluid passageways for a two-phase fluid and constructed in accordance with the teachings of the present disclosure.

Referring now to FIG. 13, another form of a heater system is illustrated and generally indicated by an apparatus 300. The apparatus 300, which is a heater in one form of the present disclosure, includes a base member 310 having at least one fluid passageway 320. Multiple fluid passageways 320 are illustrated in this form, and the passageways 320 may further define zones (such as the heater zones as set forth above) in another form of the present disclosure. A two-phase fluid 325 is disposed within the fluid passageways 320, and a pressure of the two-phase fluid 325 is controlled such that the two-phase fluid 325 provides heating to the base member 310. This system is described in greater detail, for example, in U.S. Pat. Nos. 7,178,353 and 7,415,835 and also in published U.S. application No. 20100076611, the contents of which are incorporated herein by reference in their entirety. Generally, in these systems, pressurized refrigerant is provided as a condensed liquid and also in a gaseous state. The condensed liquid is expanded to a vaporous mix, and the gaseous refrigerant is added to reach a target temperature determined by its pressure. Temperature corrections can thus be made very rapidly by gas pressure adjustments. Such systems are provided by Advanced Thermal Sciences Corporation and may be employed with the teachings of the present disclosure. As further shown, a tuning layer 330 is secured to the base member 310 and includes a plurality of zones 335. This tuning layer 330 is similar to the tuning layers and heaters set forth above, and as such, will not be described again in detail for purposes of clarity. Similar to the forms set forth above, the tuning layer 335 has lower power than the base member 310. And as further shown, a component 340 (shown in dashed lines), such as by way of example, a chuck, a pedestal, a wafer table, a substrate support, or a showerhead, is secured to the tuning layer 330. As used herein, a "component" should be construed to mean any member or assembly on which a wafer is supported, either directly or indirectly, for processing.

In one form, the tuning layer 330 is a heater, and yet in another form, the tuning layer 330 is a temperature sensor, as set forth in detail above. This tuning layer 330, and also the base member 310, may be designed with a material having sufficient TCR characteristics such that they function as both a heater and as a temperature sensor. Additionally, a secondary tuning layer (shown in FIG. 5) is secured to a top surface of the component 340, and it should also be understood that any number of tuning layers, functioning as heaters and/or temperature sensors, may be employed while remaining within the scope of the present disclosure. With the secondary tuning layer secured to the top surface of the component 340, the wafer would be supported indirectly, versus directly when the wafer is on the top surface of the component 340.

The apparatus 300 may also employ the routing layer 66 as shown in FIG. 2 in order to accommodate a number of power lines. Additional features as set forth herein throughout the figures may also be employed with this form of the present disclosure having a base member 310 with fluid passageways 320 while remaining within the scope of the present disclosure.

Figure 15:
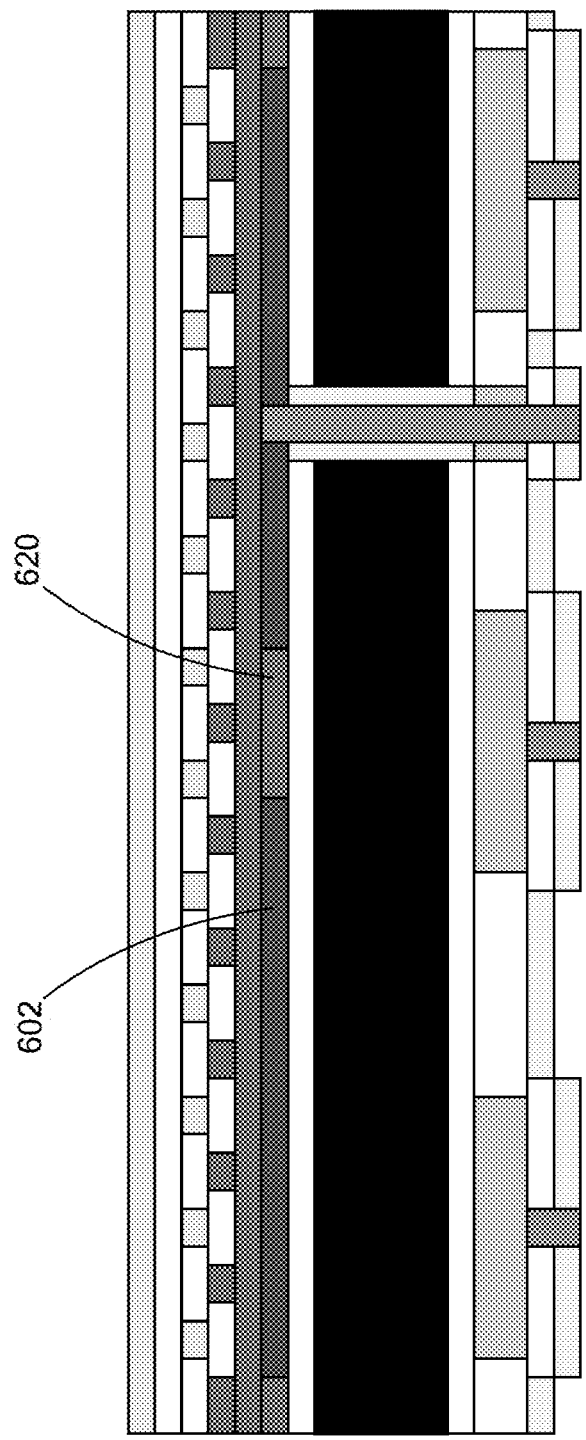
FIG. 15 is a cross-sectional view illustrating the support elements in accordance with the teachings of the present disclosure.
Figure 16:
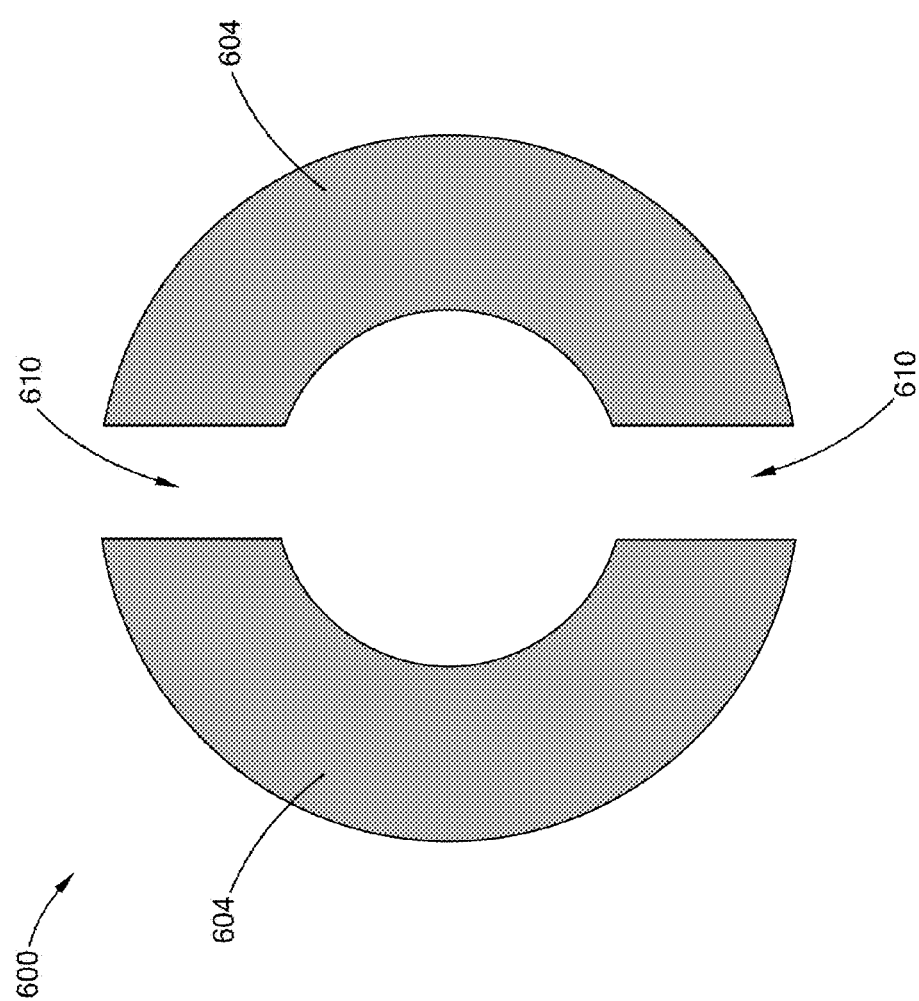
FIG. 16 is an enlarged plan view of a support element in accordance with the teachings of the present disclosure.

Referring now to FIGS. 14-16, another form of the present disclosure includes a plurality of support elements 600 that are provided between the tuning heater layer and the boost heater layer in order to provide the requisite flatness during manufacture, which in this form is a press process. More specifically, in this form of the present disclosure, the support elements 600 are etched into a copper layer 602 having a heater circuit. As shown in FIG. 14, a relatively large space is present between traces in the copper layer 602, which is somewhat of a void that contributes to a non-flat laminate, or a laminate that has an undesirable flatness. By providing support elements 600, additional structure is provided in order to improve flatness. And as shown in FIG. 16, the support elements 600 are in a "split" configuration, or are comprised of two portions 602 and 604 having an opening 610 therebetween. As such, the adhesive 620 (shown in FIG. 15) is allowed to flow more evenly between each of the support elements 600.

Figure 17:
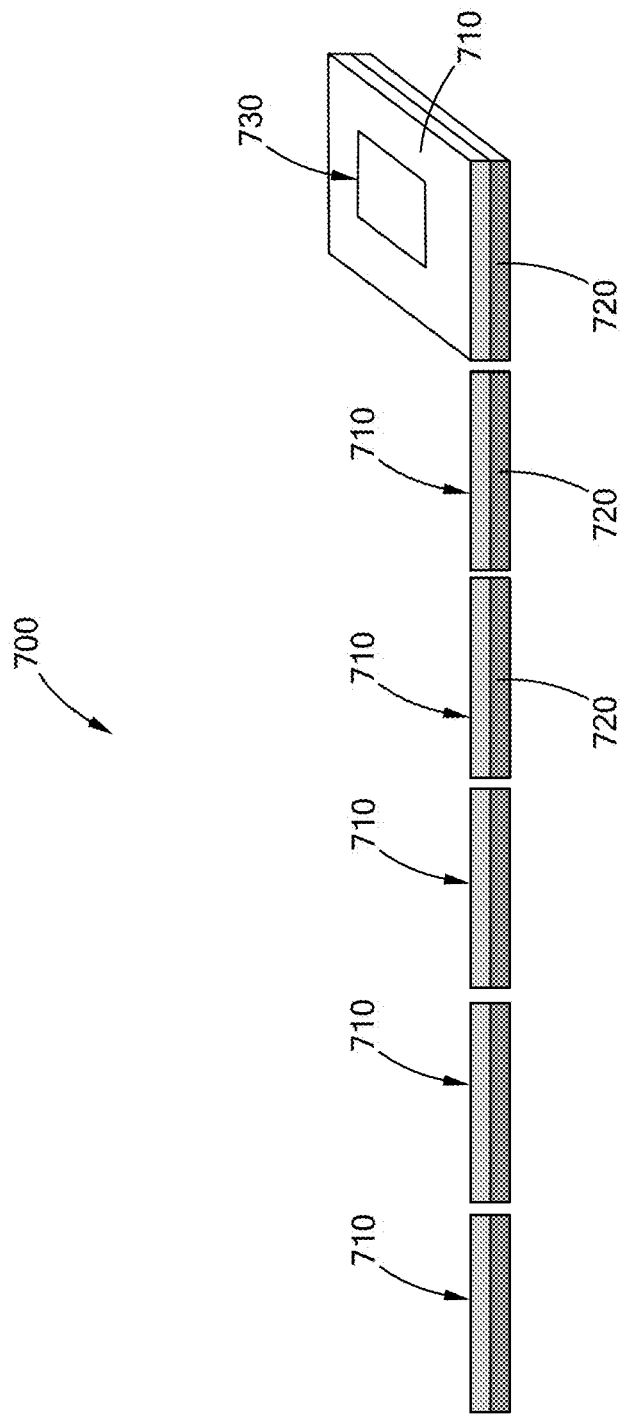
FIG. 17 is a perspective view illustrating heat spreaders constructed in accordance with the teachings of the present disclosure.

As shown in FIG. 17, another form of the tuning heater 700 is illustrated, wherein a corresponding plurality of heat spreaders 710 are disposed on each of the elements 720 to provide temperature uniformity across the individual elements 720. The heat spreaders 710 can be a variety of materials, including but not limited to, Aluminum, Copper, and Pyrolytic Graphite, including PGS (Pyrolytic Graphite Sheet). In one form, the heat spreaders 710 are a monolithic and constant thickness configuration as shown. However, it should be understood that other configurations, including integral grooves, or heat guides, 730 may also be provided while remaining within the scope of the present disclosure.

Each of the tuning layers/heaters set forth herein are controlled by a control system, various forms of which are set forth in greater detail in co-pending applications, U.S. application Ser. No. 13/598,985, filed on Aug. 30, 2012 and titled "System and Method for Controlling a Thermal Array," and U.S. application Ser. No. 13/598,995, filed on Aug. 30, 2012, and titled "Thermal Array System," which are commonly assigned with the present application and which are incorporated in reference in their entirety. Generally, the control systems have a plurality of sets of power lines in communication with the tuning layer and a plurality of addressable control elements in electrical communication with the power lines and with the tuning layer, the control elements providing selective control of the tuning layer zones. The control elements may be, by way of example, threshold voltage switching circuits, which may be semiconductor switches. The threshold voltage switching circuits may be packaged, for example in an ASIC (Application Specific Integrated Circuit). Furthermore, the control elements may be embedded within the component, such as the chuck, as set forth above. These control systems and their related algorithms are described and illustrated in greater detail in the co-pending applications set forth above and thus are not included herein for purposes of clarity.

Figure 18:
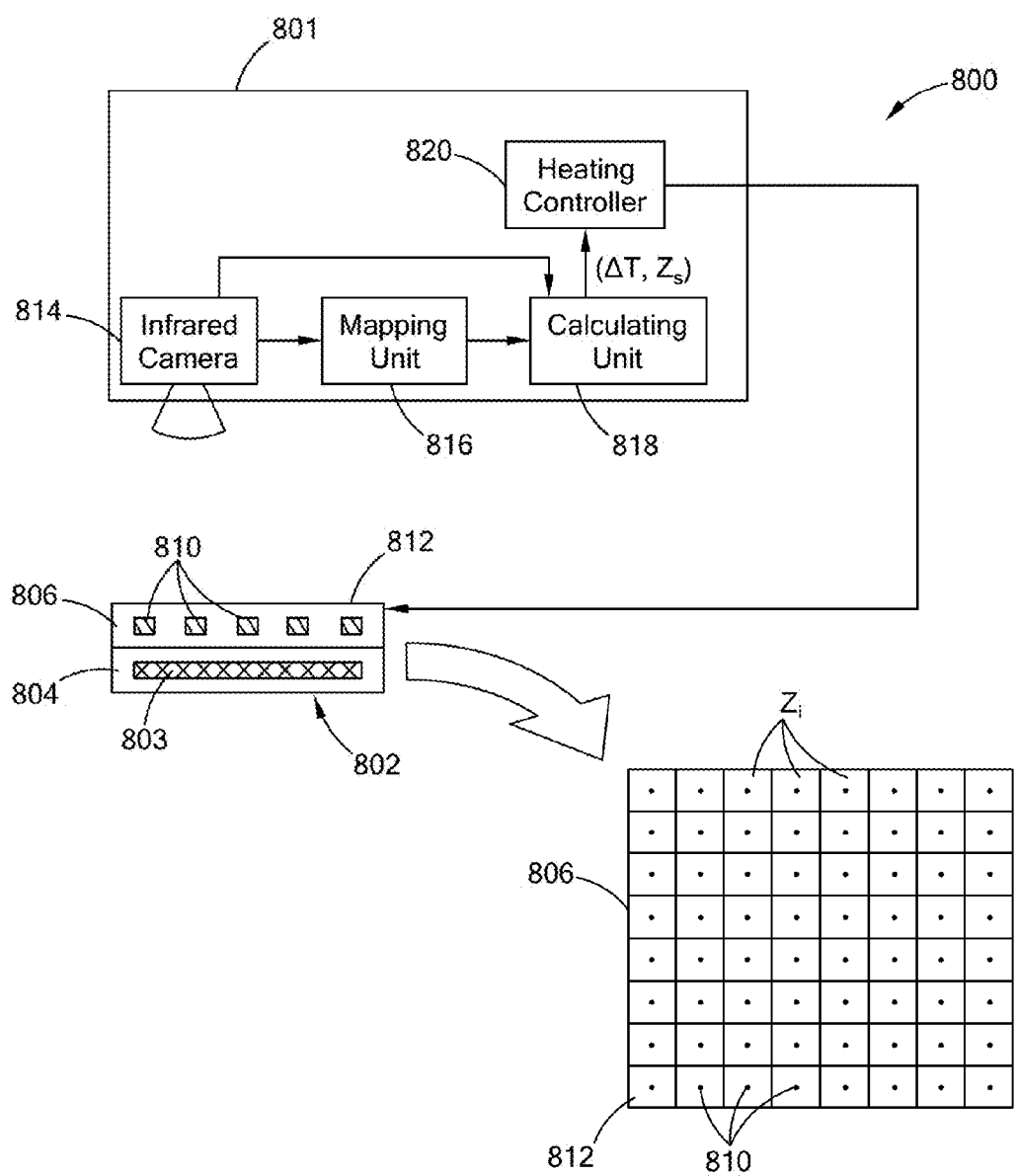
FIG. 18 is a schematic view of a heater system including a heater assembly and a closed-loop control system and constructed in accordance with the principles of the present disclosure.

Referring to FIG. 18, a heater system 800 includes a closed-loop control system 801 and a heater assembly 802. The heater assembly 802 includes a base heater layer 804 and a tuning heater layer 806. The tuning heater layer 806 defines a plurality of heating zones ($Z_i$) in which a plurality of heating elements 810 are disposed and independently controllable. As previously described, the base heater layer 804 provides a primary heating to a heating target (not shown), such as a substrate in a semiconductor processing chamber, whereas the tuning heater layer 806 provides fine-tuning of the temperature distribution over a heating surface 812 of the heater assembly 802 to compensate for variations in the heater assembly 802.

Variations generally exist in the heater assembly 802, causing the heater assembly 802 to be unable to reach a desired temperature profile. The variations may occur in the heater assembly 802 due to manufacturing deviations or in the environment due to changed operating conditions. More specifically, variations may occur in the heater assembly 802 due to variations in the heating element 803 in the base heater layer 804, variations in the heating elements 810 of the tuning heater layer 806, variations in the bonding layers (not shown) that bond different layers together to form the heater assembly 802 or variations in the materials used.

Variations in the environment generally occur during heater operation and may be changed dynamically. The variations may include new loads placed on the heating surface 812 or changed air flow proximate the heating surface 812. As one example, when a frozen hamburger patty is placed on the heating surface 812, the frozen hamburger patty, as a new load, causes the temperature of the area of the heating surface 812 on which the frozen hamburger patty is placed to decrease. As a result, a uniform heating cannot be achieved even when a uniform power is supplied to the plurality of heating elements 810 in the plurality of the heating zones (Zi). As another example, in a semiconductor processing chamber, a processing gas may be injected proximate the heating surface 812 during operation to cause temperature differences in the heating surface 812. Still another example, temperature difference on the heating surface 812 may be caused by fixtures or mounting means proximate the heater assembly 802, which constitute heat sinks to absorb heat from the heater assembly 802.

The closed-loop control system 801 according to one form of the present disclosure provides a closed-loop control for the heater assembly 802 taking into consideration these variations, whether they occur in the heater assembly 802 or in the environment. The closed-loop control system 801 includes an imaging device 814, a mapping unit 816, a calculating unit 818, and a heater controller 820.

The imaging device of the present disclosure may be an infrared camera 814, but the imaging device may also be any thermographic camera or video camera that continuously captures variations in the heater system. A power is first supplied to the base heater layer 804 to increase the temperature of the heating surface 812. When variations exist inside or outside the heater assembly 802 (i.e., in the environment), the heating surface 812 may not reach a uniform temperature. The heating surface 812 in different heating zones may emit different levels of infrared radiation, which is a function of the temperature of heating surface 812. The infrared camera 814 continuously captures the infrared radiations from the plurality of heating zones (Zi) and generates a plurality of thermal images accordingly. The thermal images each define a plurality of pixels corresponding to the plurality of heating zones (Zi) in the tuning heater layer 806 and representing temperatures of the heating surface 812 in different heating zones (Zi). When a color of a pixel in the thermal image deviates from the color of adjacent pixels, it can be determined that variations exist in the heating zone that corresponds to this particular pixel.

The thermal images are sent to the mapping unit 816 for mapping to determine specific heating zones (Zs) in which such variations exist. The mapping unit 816 includes information about the relationship between the plurality of pixels on the thermal image and the plurality of heating zones (Zi) in the tuning heater layer 806. By this mapping, the specific heating zone (Zs) in which variations exist can be determined.

After the specific heating zones (Zs) are identified, the thermal image and the information about the specific heating zones (Zs) are sent to the calculating unit 818 to calculate the actual temperature of the heating surface 812 in the specific heating zones (Zs). The calculating unit 818 also calculates the difference between the actual temperature and a desired temperature in the specific heating zone (Zs). The temperature difference ($\Delta T$) between the actual temperature and the specific heating zone (Zs) where variations exist is sent to the heater controller 820 as a feedback. Therefore, the heater controller 820 can control the heating elements 810 in the specific heating zones (Zs) differently from the heating elements 810 in the remaining heating zones (Zi) where no variations exist. The control system 800 provides a closed-loop feedback control of the heater assembly 802 to adjust and fine-tune the heater assembly 802 based on the thermal images and according to a desired uniform or non-uniform temperature profile.

Figure 19:
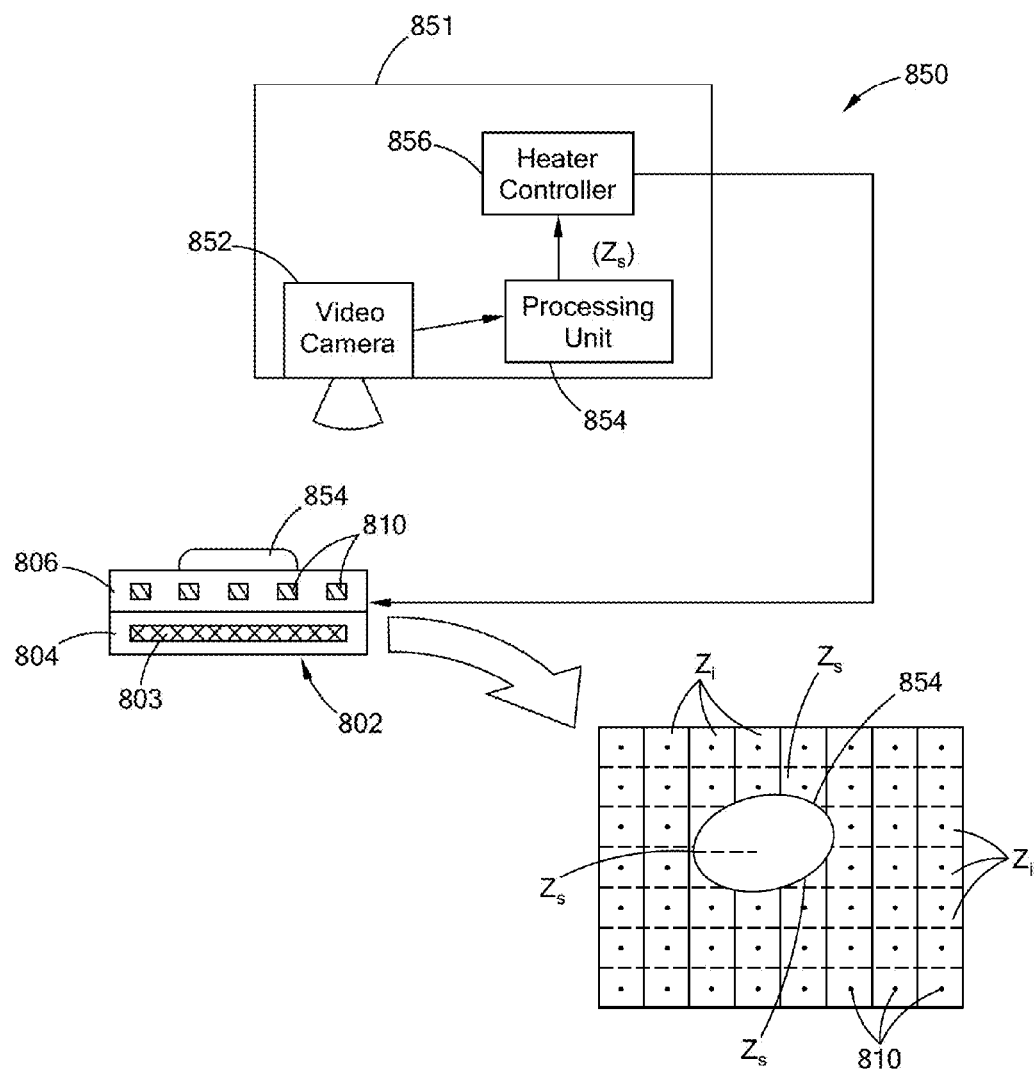
FIG. 19 is a schematic view of a heater system including a heater assembly and a closed-loop control system and constructed in accordance with the principles of the present disclosure.

Referring to FIG. 19, a heater system 850 includes a heater assembly 802 and a closed-loop control system 851 for controlling the heater assembly 802 that includes a base heater layer 804 and a tuning heater layer 806. The closed-loop control system 851 includes a video camera 852, a processing unit 854, and a heater controller 856. The video camera 802 can recognize new loads or changes or stimulus to the system. For example, when a frozen hamburger patty 854 is placed on the heating surface 812 of the heater assembly 802, the video camera 852 acquires images of the heating surface 812, showing location of the frozen hamburger patty 854. When the video camera 852 acquires images of the heater assembly 802, the heater assembly 802 can be in an activated (heating is provided) or de-activated state (no heating is provided).

The images each define a plurality of pixels that correspond to the plurality of heating zones ($Z_i$) in the tuning heater layer 806. The images are sent to the processing unit 854 to determine the specific heating zones (Zs) in which the hamburger patty 854 is located. The information about the specific heating zone (Zs) is sent to the heater controller 856 as a feedback, indicating that only the heating elements 810 in the specific heating zones (Zs) need to be activated or power to the specific heating zones (Zs) need to be increased. Since the heating elements 810 outside where the hamburger 854 is located are not activated or receive lower power, the control system 851 can more efficiently manage the heat distribution on the heating surface 806 according to the need.

While not shown in the drawings, it is understood that the control system 801 of FIG. 18 and the control system 851 of FIG. 19 can be combined into a single closed-loop control system such that variations inside the heater assembly 802 or in the environment can be identified and compensated for by the control system.

Figure 20:
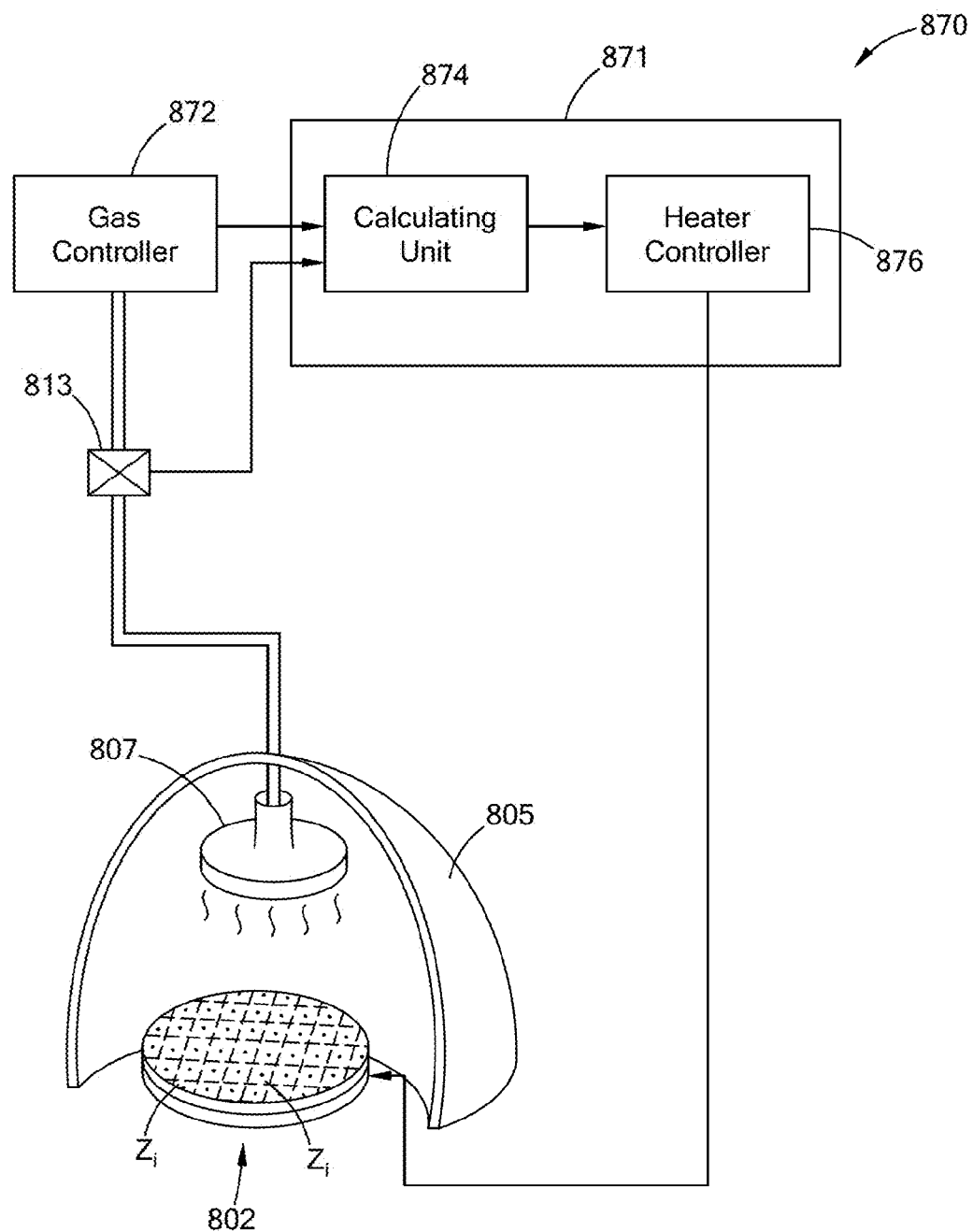
FIG. 20 is a schematic view of a heater system including a heater assembly and a closed-loop control system and constructed in accordance with the principles of the present disclosure.

Referring to FIG. 20, a heater system 870 includes a heater assembly 802 and a closed-loop control system 871 for controlling the heater assembly 802. The heater assembly 802 is disposed in a processing chamber 805 that includes a gas shower head 807 to provide processing gases to a heating target (not shown), such as a wafer. In this embodiment, the heater assembly 802 may take the form of an electrostatic chuck for supporting and heating a wafer. As shown, the gas shower head 807 is disposed above the heater assembly 802 to inject processing gas into the processing chamber 805. The processing gas, which has a temperature different from that of the heating surface 812, may cause disturbance to a desired temperature distribution on the heating surface 812. To compensate for the disturbance, the closed-loop control system 871 includes a calculating unit 874 in electrical communication with a gas controller 811 and a gas valve 813, and a heater controller 876. The gas controller 811 controls gas injection into the processing chamber 805 and stores information about the type, mass, and temperature of the gas to be injected into the processing chamber 805. The gas valve 813 controls timing of the gas injection. The information about the gas injection, such as the type, mass, temperature and timing of the gas injection, is sent to the calculating unit 874 to calculate and determine the anticipated disturbance to a desired temperature profile. The anticipated disturbance is sent to the heater controller 876, which, in turn, activates or change the power to the individual heating elements 810 in response to the anticipated disturbance. Since the heating elements 810 in the plurality of heating zones (Zi) are independently controllable, the control system 871 can better control the heater assembly 802 based on the anticipated disturbance and according to a desired temperature profile. Therefore, the control system 870 provides a closed-loop control for the heater assembly 802 to offset the disturbances to the desired temperature profile that the gas injection would otherwise cause.

While not shown in the drawings, it is understood that the closed-loop control system 870 can be in electrical communication with any controller that has information about any anticipated stimulus or disturbance to the heater assembly 802 that would otherwise disturb the desired temperature profile. The closed-loop control system 870 can control the plurality of heating elements 810 in the tuning heater layer 860 accordingly when the anticipated stimulus occurs.

Figure 21:
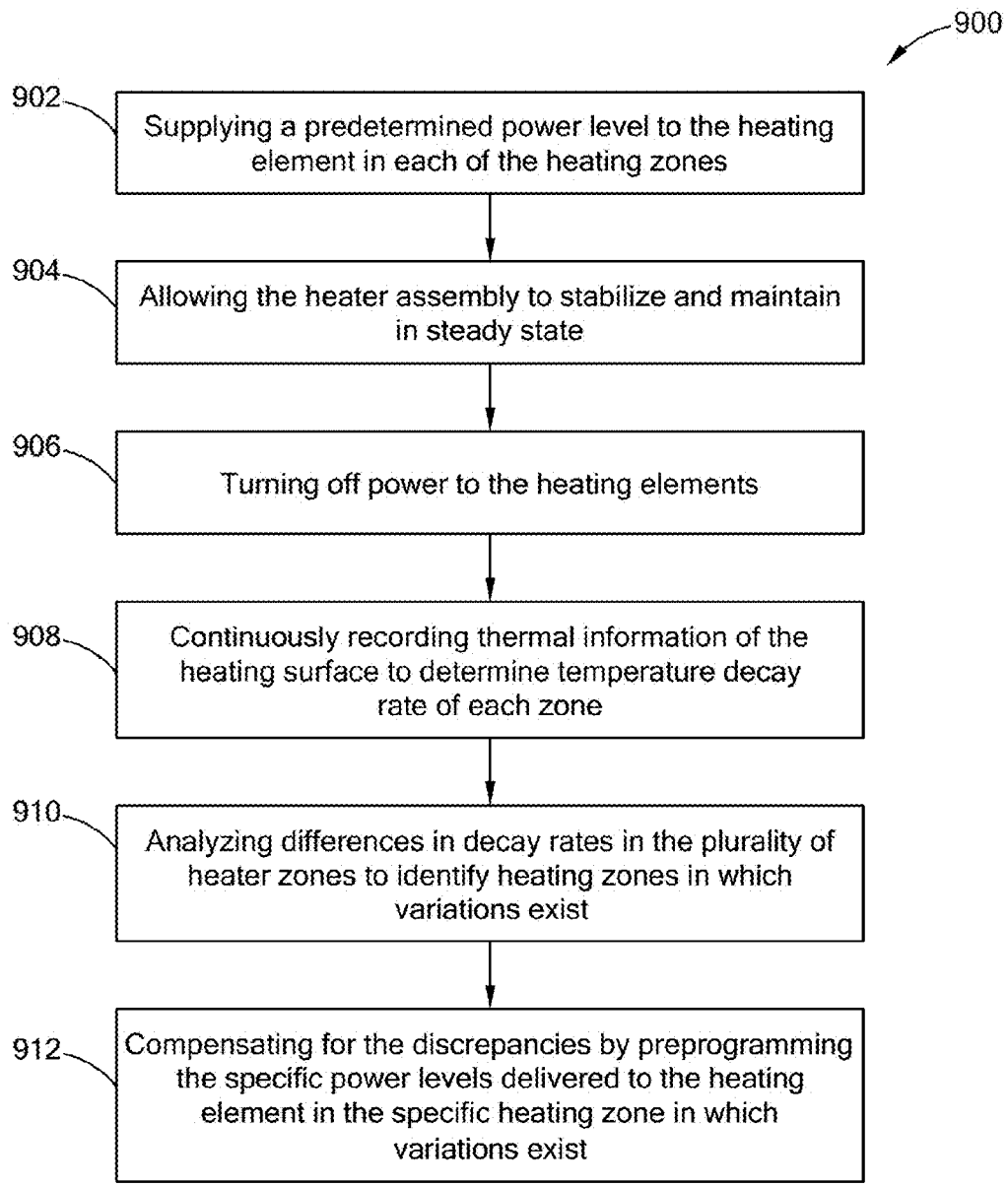
FIG. 21 is a flow diagram of a method of controlling a heater assembly in accordance with the principles of the present disclosure.

Referring to FIG. 21, a method 900 of calibrating a heater assembly 802 to compensate for variations in the heater assembly 802 is shown. The heater assembly 802 includes a base heater layer 804 and a tuning heater layer 806 having a plurality of resistive heating elements 808. In addition to provide tuneability of the temperature of the heating surface 812, the plurality of heating elements 808 can also function as a plurality of sensors to measure the temperature of the plurality of heating zones (Zi) and to diagnose the performance of the heater assembly 802. Using a heating element as both a heater and a sensor has been described in U.S. Pat. No. 7,196,295, titled "TWO-WIRE LAYERED HEATER SYSTEM," issued on Mar. 27, 2007, the disclosure of which is incorporated herein by reference in its entirety.

A predetermined power level is supplied to the heating element 810 in each of the heating zones 808 in step 902. The heater assembly 802 is allowed to stabilize and maintained in a steady state in step 904. Upon reaching steady state, the heating elements 810 in the plurality of heating zones (Zi) in the tuning heater layer 806 is power off in step 906. A control system then continuously records the thermal information of each heating zone, such as the temperature decay rate of each heating zone in step 908. Since the heating elements 810 are also used as sensors, no additional sensors are required to monitor the temperature decay rates. Differences in temperature decay rates in the plurality of heater zones are analyzed in step 910.

As previously described, variations may exist in the heating zones 808 due to non-uniform material properties and/or non-uniform bonds throughout the heater assembly 802 or manufacturing deviations in the plurality of heating elements 810. The variations may contribute to differences in temperature decay rate from steady state. By analyzing the temperature decay rate, the specific heating zones where variations exist may be identified. After the specific heating zones are identified, the discrepancies can be used to compensate or pre-program the specific power levels delivered to the specific heating zones in step 912. Therefore, a desired temperature profile can be achieved despite the existence of variations. The desired temperature profile may be a uniform temperature profile or a predetermined non-uniform temperature profile.

Figure 22:
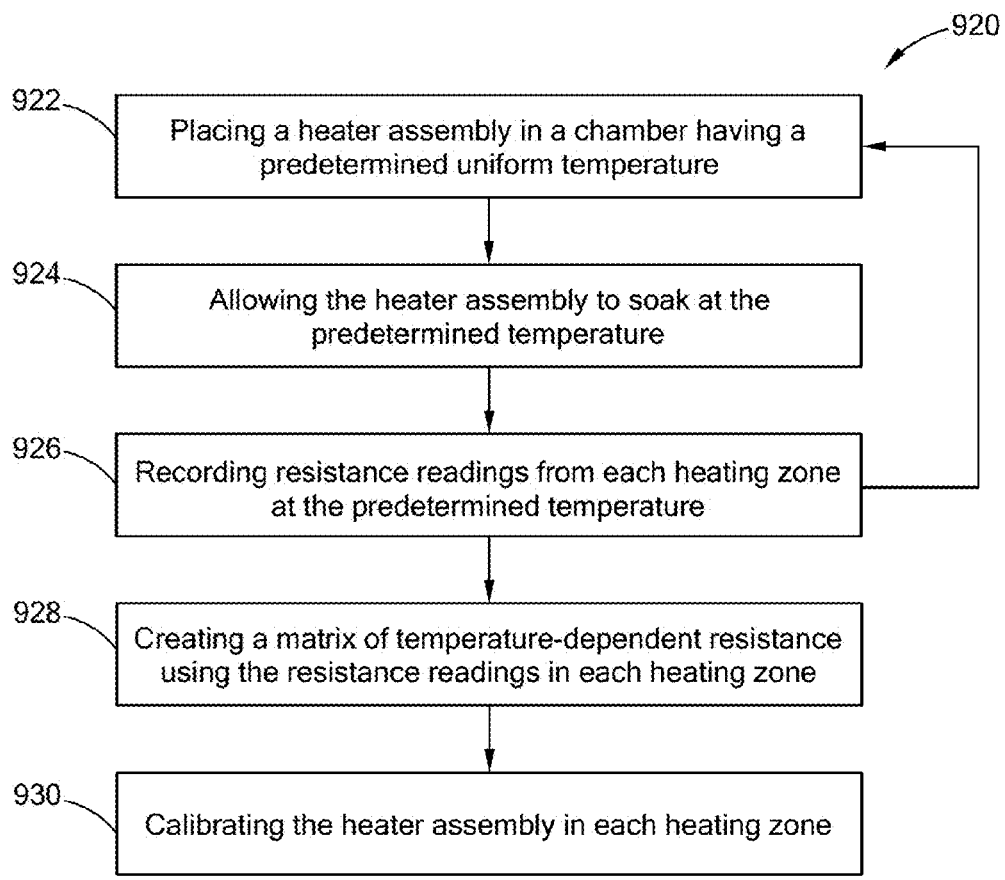
FIG. 22 is a flow diagram of a method of controlling a heater assembly in accordance with the principles of the present disclosure.

Referring to FIG. 22, a method 920 of in-situ calibrating a heater assembly 802 to compensate for variations in the environment is shown. The heater assembly 802 is placed in an environmental chamber at a predetermined uniform temperature in step 922. The heater assembly 802 is allowed to soak at the predetermined uniform temperature in step 924. The resistance readings of the heating elements 810 in the plurality of heating zones 808 are recorded in step 926. Steps 922 to 926 can be repeated by changing the predetermined temperatures. The resistance readings are used to create a matrix of temperature-dependent resistances in each heating zone in step 928. The temperature-dependent resistance can be used to calibrate the heater assembly 802 in each heating zone in step 930.

In this method, the calibration is performed when the heater assembly 802 is placed in an environment chamber where variations in the environment may affect the temperature distribution on the heating surface 812 of the heater assembly 802. Therefore, the method can calibrate the heater system taking into account dynamic variations in the environment.

In addition to dynamic variations in the environment, variations in the heater assembly 802 due to material degradation over time may dynamically affect a desired temperature distribution. Material may degrade at different rates in different heating zones (Zi). The method 920 can be used to measure and record the temperature response of each heating zone over time such that the heater assembly 802 can be re-programmed to compensate for degradation in each heating zone in order to improve system performance over time.

In other words, this method 920 can monitor how variations in the constituent components of the heater assembly 802 and/or in the surrounding environment affect a desired temperature profile of the heater assembly 802 and provide a real time fine-tuning of the control algorithms. The real time fine-tuning can proactively anticipate and compensate for similar variations and/or stimulus in subsequent process cycles and achieve in-situ adjustment. In addition, the recorded actual temperature information for each heating zone can be captured and used as confirmation or certification that a desired temperature has been reached. For example, the recorded actual information for each heating zone may be used to certify that a hamburger or other food was cooked properly to assure safe consumption.

Figure 23A:
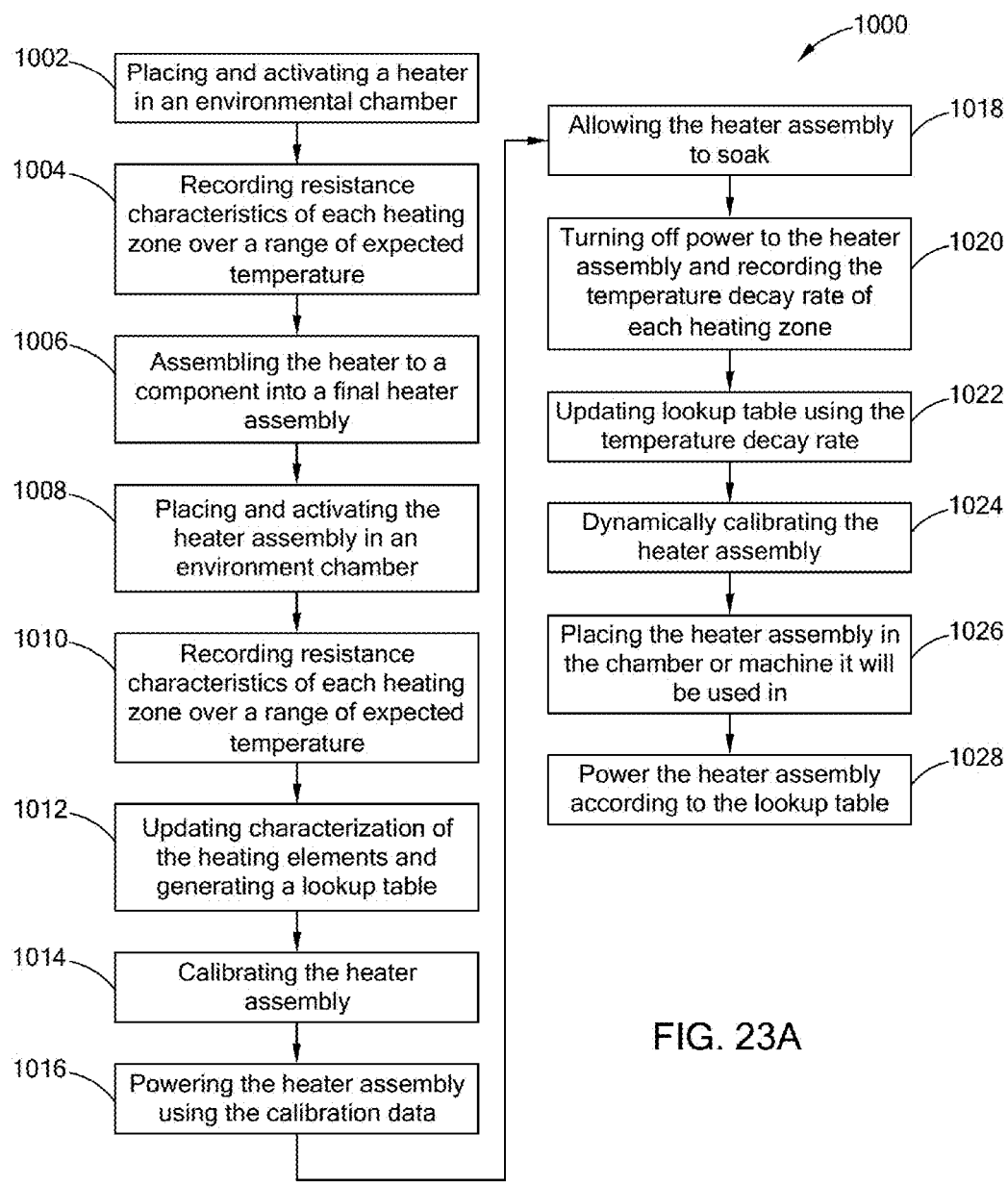
FIGS. 23A and 23B are a flow diagram of a method of calibrating a heater assembly in accordance with the principles of the present disclosure.
Figure 23B:
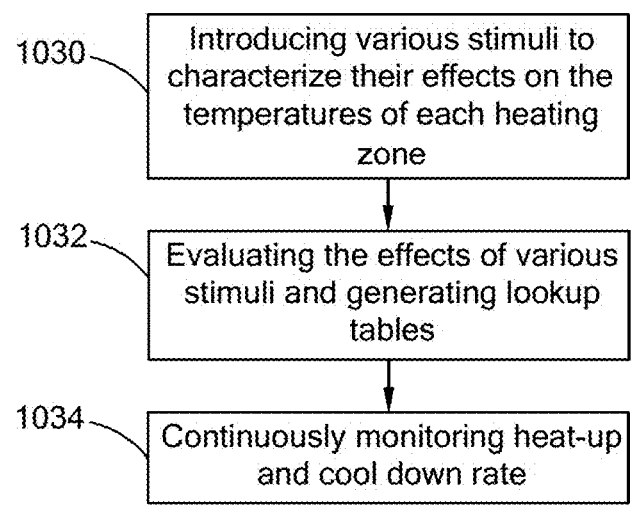

Referring to FIGS. 23A and 23B, a method 1000 of calibrating a heater assembly 802 according to another embodiment of the present disclosure is shown. The method 1000 starts with placing and activating a heater in an environment chamber in step 1002. The resistance characteristics of each heating zone (Zi) over a range of expected temperatures are recorded to characterize the relationship between the resistance and the temperature for each heating zone in step 1004. The heating elements 812 in the plurality of heating zones (Zi) may have different temperature coefficient of resistance (TCR) due to manufacturing deviation, resulting in differences in resistance of the heating elements in the plurality of heating zones at an elevated temperature. The temperature-dependent resistance characteristics of the heating elements 812 are reduced to specific data or resistances for specific temperature for each zone.

The heater is then assembled to a component into a final heater assembly such as a bonded chuck assembly in step 1006. The final heater assembly is placed into an environmental chamber and is activated in step 1008. The final heater assembly is heated to a plurality of temperatures. The resistance characteristics of each heating zone (Zi) over a range of expected temperatures are recorded to characterize the relationship between the resistance and the temperature for each heating zone in step 1010. This step is similar to step 1004 except that the heater is assembled with a component to form a heater assembly. In step 1004, the variations in each heating zone are captured when the heater stands alone. After the heater is assembled to another component, the component and/or the bonding layer(s) between the heater and the component may cause variations in the heating zones (Zi). Therefore, step 1010 further determines variations in the heater assembly as a whole.

The characterization and data regarding each heating zone is updated and used as calibration data and a lookup table based on the calibration data is generated in step 1012. The final heater assembly is calibrated accordingly to compensate for the variations in the heater assembly in step 1014.

Next, the final heater assembly is activated to a predetermined temperature using the calibration data in step 1016. The plurality of heating elements in the plurality of heating zones (Zi) may be powered differently taking into consideration the variations in the heating zones (Zi). The final heater assembly is then allowed to stabilize in the steady-state condition in step 1018.

Next, the power to the final heater assembly is turned off and the temperature decay rate of each heating zone is recorded over time in step 1020. The temperature decay rate is used to update the lookup table in step 1022. The differences in the temperature decay rates in different heating zones represent discrepancies between the actual thermal response of the assembly and what is expected from modeling. Steps 1020 may be repeated at multiple temperatures. The heater assembly is then calibrated in step 1024.

Next, the final heater assembly is placed into the chamber or machine it will be used in step 1026. The data from step 1024 is used to power the assembly to a known uniform temperature for each heating zone in step 1028. Any discrepancies between the required and anticipated power levels required to maintain all heating zones at desired temperatures represent the various thermal dynamic attributes of that particular chamber assembly and that information is captured for fine-tuning and calibration of the final system assembly.

Various system stimuli, such as gas injection, introduction of wafers, etc. can be introduced to characterize their respective effects on the temperatures of each heating zone in step 1030. All of this information is evaluated and used to create various look up tables and control algorithms for use in the actual use of the system in step 1032. The system continuously monitors heat-up and cool-down rates of each heating zone during each temperature cycle looking for discrepancies from expected thermal response rates in step 1034.

This method has the advantages of allowing the heater assembly to be calibrated to compensate for its own drift over time. Optionally, proactive alarms may be provided when expected results do not match actual thermal response results. Failure modes may be determined and stored in the heater controller. The failure modes can be used in subsequent cycles to determine whether the heater assembly is operated normally. Infrared cameras and video cameras as described in FIGS. 18 and 19 may be used to help monitoring and predicting performance of the heater assembly. The heater controller may produce information that documents or validates that the actual temperatures were reached in the process to assure good products. The operator can enter data from testing of products produced by the system that allow the control system to compensate or further fine tune the system performance in order to improve product or yields produced by the system in the future. The data can be used to make corresponding adjustments and improvements in heater manufacturing process steps.

Figure 24:
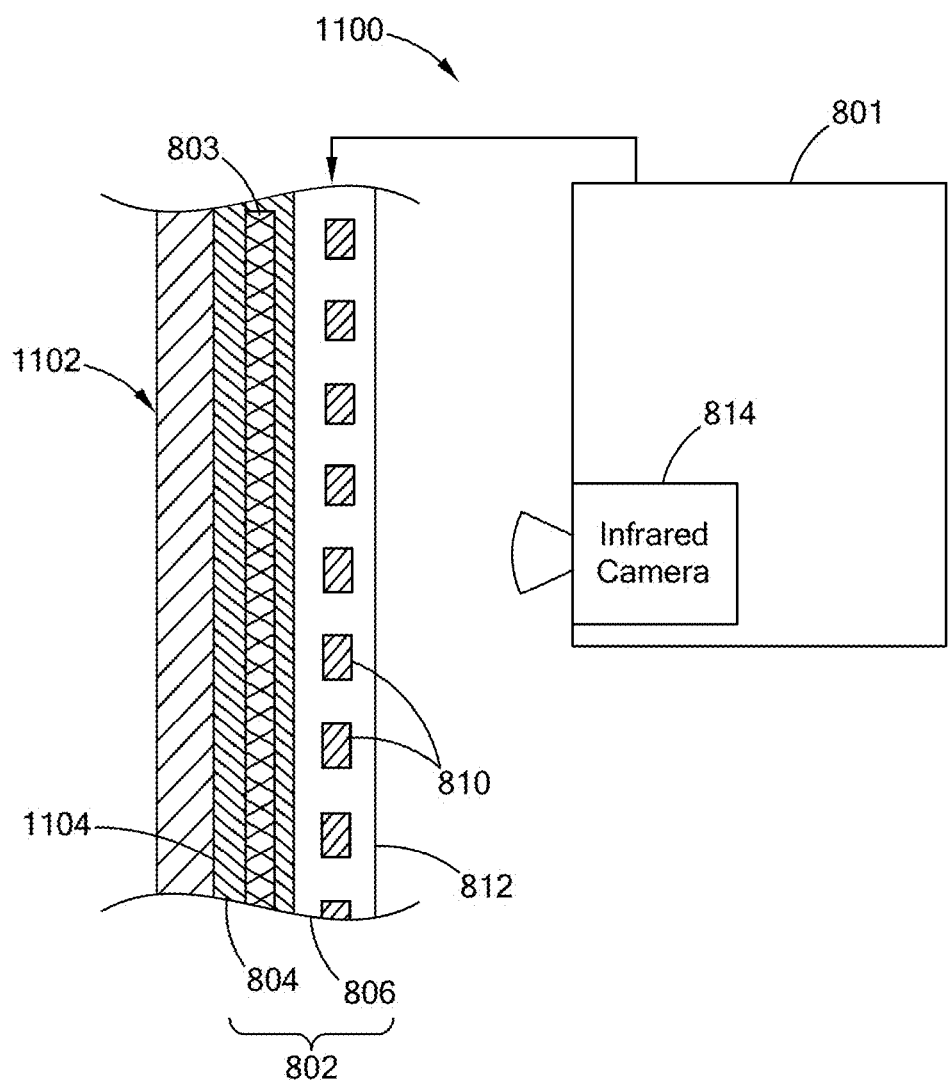
FIG. 24 is a schematic view of a heater system including a heater assembly and a control system and constructed in accordance with the principles of the present disclosure.

Referring to FIG. 24, a heater system 1100 according to another embodiment of the present disclosure includes a semiconductor processing chamber 1102 having an interior wall 1104, a heater assembly 802 disposed on the interior wall 1104, and a control system 801. The heater assembly 802 and the control system 801 in the present embodiment are similar to those described in FIG. 18 and thus similar references are used and the detailed description thereof is omitted herein for clarify.

In the present embodiment, the heater assembly 802 is disposed on the interior wall 1104 of a semiconductor processing chamber 1102 so that the heating surface 812 of the heater assembly 802 constitutes an interior surface of the semiconductor processing chamber 1102. The heater assembly 802 is used to determine variations in the interior surface of the semiconductor processing chamber 1102 by monitoring the temperature distribution of the heating surface 812.

As previously described, the plurality of heating elements 810 in the tuning heater layer 806 may have relatively high temperature coefficient of resistance (TCR) so that the heating elements 810 can be used as both heaters and sensors. In other words, the resistance of each of the heating elements 810 changes linearly with temperature changes, whether proportionally or inverse-proportionally. By monitoring the resistance of each of the heating elements 810, the temperature of each of the heating zones ($Z_i$) can be determined.

Processing gases are generally injected into the semiconductor processing chamber 1102 for treating a wafer (not shown). The processing gases may be deposited on or accumulated on the interior surface of the processing chamber 1102, causing particulates generation, unstable process, wafer contamination, yield loss and throughput. To avoid these problems, the processing chamber 1102 needs to be periodically cleaned. The heater assembly 802 can be used to determine when the cleaning is completed.

When the interior surface is not completely cleaned, unwanted depositions and particles still remain in some areas of the interior surface (i.e., the heating surface 812), causing variations in the plurality of heating zones ($Z_i$). Therefore, the control system 801, which includes an infrared camera 814 to capture thermal images of the heating surface 812, can determine whether variations exist in the plurality of heating zones ($Z_i$). The existence of variations provides an indication that some unwanted depositions and particles still remain on the interior surface 812. Therefore, the control system 801 can determine whether cleaning of the interior surface 812 and thus the processing chamber 1102 is completed by using the heater assembly 802. In addition, the system can record a cleaning time to provide an accurate prediction of the down time and preventive maintenance scheduling for the processing chamber 1102.

It should be noted that the disclosure is not limited to the embodiments described and illustrated as examples. A large variety of modifications have been described and more are part of the knowledge of the person skilled in the art. These and further modifications as well as any replacement by technical equivalents may be added to the description and figures, without leaving the scope of the protection of the disclosure and of the present patent.

What is claimed is:

1. A heater system comprising:
    a heater assembly including a heating surface for heating a heating target, the heating surface defining a plurality of heating zones;
    an imaging device that acquires a thermal image of the heating surface of the heater assembly; and
    a control system that determines variations in the plurality of heating zones based on the thermal image of the heating surface, wherein the thermal image includes a plurality of pixels corresponding to the plurality of heating zones in the heater assembly.

2. The heater system according to claim 1, wherein the imaging device is one of an infrared camera and a video camera.

3. The heater system according to claim 1, wherein the plurality of pixels represent temperatures of the plurality of heating zones.

4. The heater system according to claim 3, wherein the control system is configured to determine that variations in at least one of the heating zones occur when at least one of pixels has a color different from that of adjacent pixels.

5. The heater system according to claim 4, wherein the control system comprises:
    a mapping unit to determine from the thermal image the heating zone of the identified variations;
    a calculating unit to determine a difference between the actual temperature and a predetermined temperature in the heating zone; and
    a heater controller to control the heating elements in the heating zone differently according to the mapping unit and the calculating unit to achieve a predetermined temperature profile across the heater assembly.

6. The heater system according to claim 1, wherein the heater assembly further comprises a plurality of heating elements that are disposed in the plurality of heating zones and that are independently controllable.

7. The heater system according to claim 6, wherein the control system selectively activates, deactivates or changes a power to the heating elements in the plurality of heating zones to compensate for the variations.

8. The heater system according to claim 1, wherein the imaging device is a video camera that is configured to identify a location of a new load that is placed on the heating surface of the heater assembly.

9. The heater system according to claim 8, wherein the control system further includes a processing unit that determines specific heating zones in the heater assembly in which the new load is located based on the thermal image.

10. The heater system according to claim 9, wherein the control system selectively activates or increases a power to heating elements in the specific heating zones.

11. The heater system according to claim 1, wherein the heater assembly includes a base heater layer that provides primary heating and a tuning heater layer that provides supplemental heating.

12. A heater system comprising:
a heater assembly having a heating surface and a plurality of heating elements for heating a heating target;
a controller that is configured to provide stimulus, causing a disturbance to a predetermined temperature of the heating surface of the heater assembly; and
a control system configured to be in electrical communication with the controller to receive stimulus information from the controller and to control the heater assembly to maintain predetermined temperature profile on the heating surface of the heater assembly based on the stimulus information from the controller.

13. The heater system according to claim 12, wherein the controller is a gas controller that controls gas injection through a gas shower head proximate the heater assembly.

14. The heater system according to claim 13, wherein the control system further comprises:
a calculating unit in communication with the gas controller and analyzing the gas injection includes at least one of type, mass, temperature, and timing of the gas to be injected proximate the heater assembly to calculate an anticipated disturbance to the predetermined temperature profile; and
a heater controller configured to be in electrical communication with the calculating unit to activate or change the power to each of the heating elements in response to the anticipated disturbance to compensate for the anticipated disturbance for maintaining the predetermined temperature profile.

15. The heater system according to claim 14, wherein the heater assembly is disposed in a processing chamber and the gas controller controls the injection of gas into the processing chamber.

16. The heater system according to claim 12, wherein the control system adjusts power to the heater assembly to compensate for the disturbance.

17. A heater system comprising:
a processing chamber defining an interior wall;
a heater assembly disposed on the interior wall and the heater assembly defining a heating surface including a plurality of heating zones and a plurality of heating elements, the heating surface defining an interior surface of the processing chamber; and
a control system configured to be in electrical communication with the heater assembly for monitoring a temperature distribution of the heating surface, wherein the control system by monitoring the electrical resistance of the heating elements determines the temperature distribution of the plurality of heating zones.

18. The heater system according to claim 17, wherein the control system further includes an infrared camera for generating thermal images.

19. The heater system according to claim 18, wherein the control system is configured to determine that cleaning of the processing chamber is not completed when variations exist between the temperature distribution of the plurality of heating zones based on the thermal image of the heating surface.

* * * * *